United States Patent
Ryu et al.

(10) Patent No.: US 6,882,966 B2
(45) Date of Patent: Apr. 19, 2005

(54) METHOD, AND APPARATUS FOR SIMULATING A SYSTEM USING AN OBJECT ORIENTED LANGUAGE

(75) Inventors: Hiroshi Ryu, Tokyo (JP); Yusuke Katoh, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 832 days.

(21) Appl. No.: 09/726,618

(22) Filed: Dec. 1, 2000

(65) Prior Publication Data

US 2001/0021903 A1 Sep. 13, 2001

(30) Foreign Application Priority Data

Dec. 2, 1999 (JP) .......................................... 11-343959

(51) Int. Cl.[7] .............................................. G06F 17/50
(52) U.S. Cl. ........................................... 703/14; 716/18
(58) Field of Search ............................. 703/13, 14, 15; 706/45; 716/18, 2, 7

(56) References Cited

U.S. PATENT DOCUMENTS 4,965,743 A * 10/1990 Malin et al. .................. 706/45
6,135,647 A * 10/2000 Balakrishnan et al. ........ 716/18
6,223,142 B1 * 4/2001 Bargh et al. .................. 703/15
6,237,129 B1 * 5/2001 Patterson et al. .............. 716/8

OTHER PUBLICATIONS

Technical Report of the Institute of Electronics, Information and Communications Engineers, VLDB98–46, ICD98–149, FTS98–73 (Sep. 1998) by Kurokawa.

Office action in corresponding Japanese application together with English language translation of circled portions.

* cited by examiner

Primary Examiner—Albert W. Paladini
(74) Attorney, Agent, or Firm—Whitham, Curtis & Christofferson, PC

(57) ABSTRACT

The simulation method of the present invention for simulating a system having a plurality of circuit modules using software, comprises the steps of: using an object oriented language; preparing a plurality of circuit base classes, which describe base circuit modules as classes, as a library; describing the circuit modules, to be simulated, as classes by inheriting the circuit base classes prepared as the library; and describing the system, to be simulated, by combining the circuit modules described as the classes.

24 Claims, 11 Drawing Sheets

SCHEMATIC DIAGRAM

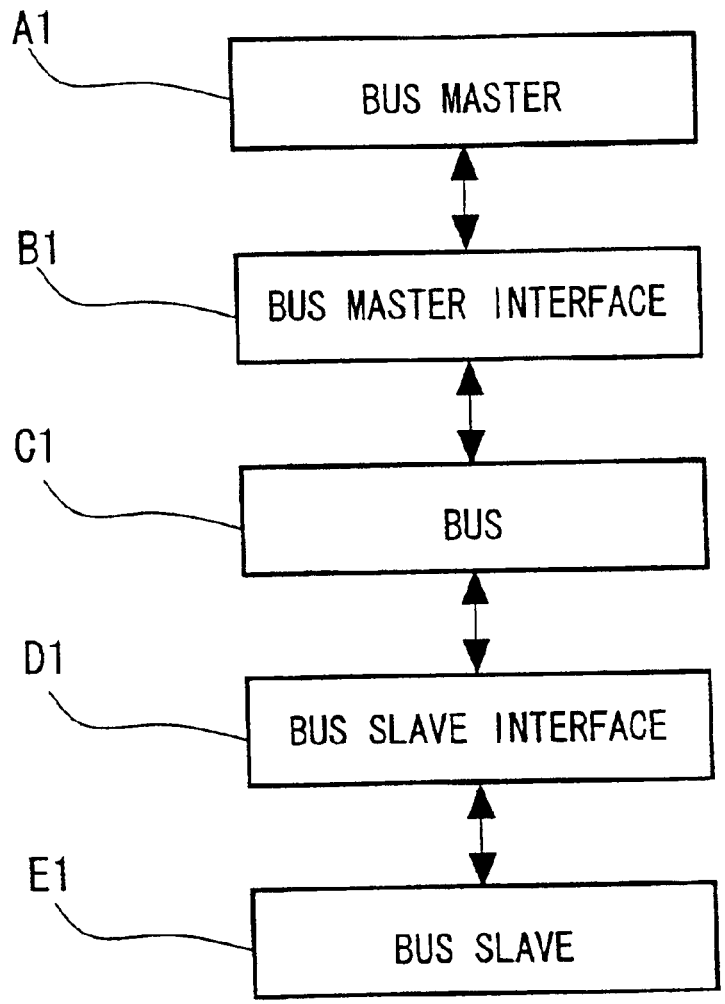

METHOD, AND APPARATUS FOR SIMULATING A SYSTEM USING AN OBJECT ORIENTED LANGUAGE

BACKGROUND OF THE INVENTION

1. Field of the Invention

The present invention relates to a method, an apparatus, and a storage medium for simulating a system using an object oriented language suitable for the simulation of a large scale system such as an SOC (System On a Chip), which includes a plurality of circuit modules, by means of software.

2. Description of the Related Art

There are conventional software simulators using the HDL (Hardware Description Language) for designing a system. Table 1 shows the examples of statements of a circuit model in the HDL, and FIG. 1 is a schematic diagram corresponding to the statement examples of Table 1. Data is input to or output from the circuit module described in the HDL through terminals. The communication between the circuit modules is made by connecting signal lines to the terminals. For example, as shown in FIG. 1, when a circuit module C includes circuit modules A and B, a terminal a1 of the circuit module A is connected to a terminal b1 of the circuit module B by providing a signal line c1 in the circuit module C ([1] in Table 1), connecting the terminal a1 of the circuit module A to the signal line c1 of the circuit module C ([2]), and connecting the terminal b1 of the circuit module B to the signal line c1 of the circuit module C ([3]). Once the signal line is connected, one of simulation models drives the signal line, and the other simulation model observes the signal value, and thus the signal can be transmitted. To make the communication between the circuit modules accurate, the terminal of one circuit module must be accurately connected to the terminal of the other circuit module.

TABLE 1

| Statement in HDL |
|---|
| Module C; |
| Wire c1, . . . |
| ModuleA A(.a1 (c1), . . .); |
| ModuleB B(.b1 (c1), . . .); |
| Endmodule |

A general design procedure for designing a system including a plurality of circuit modules using the software simulator such as the HDL will be explained. First, the system is divided into a plurality of circuit modules. At that time, considering a later step of rejoining the modules, rules of interface between the circuit modules are defined. The rules of interface describe the signal line widths and roles of the terminals of the circuit modules. The rules are described in a document in a natural language, or are orally reported, so that a number of designers have the rules in common. The circuit modules are produced according to the rules.

After all the circuit modules are produced, the system is produced (described) in the HDL to combine the circuit modules so that they can communicate with each other. It is visually judged, or it is checked by system simulation, whether the circuit modules observe the rules. When it is confirmed that the result of the simulation is correct, the actual circuit is produced, based on the HDL statements.

Software simulation using an HDL has been developed to certify small scale circuits or systems. However, there are some problems in the application of this software simulation to SOCs such as LSIs (Large Scale Integrations) having a high integration degree.

For example, when connecting two circuit modules, the functions of the terminals of both the circuit modules must be checked. The conventional simulation using the HDL does not automatically check the functions. Because the terminals can be freely named in the HDL, the names of terminals having specific meanings, such as CLOCK, or RESET, may differ between the circuit modules. Therefore, when connecting the terminals by signal lines, the meanings of the terminals of the respective circuit modules must be visually and manually checked according to the HDL statements or the other documents. Thus, when combining the circuit modules to produce the system, the designers must do the troublesome work to check the connections between the modules.

To connect the circuit modules, the connections of all the terminals of the respective circuit modules must be described. There is the problem that, to change the described connections, a number of portions in the statements must be rewritten. Even when only a clock terminal of a circuit module receives an input, the connections or disconnections of all the terminals of the circuit modules must be described. That is, whenever the connections are changed, the detailed information regarding the circuits to be connected must be rewritten. It therefore requires much labor to replace a circuit module in the system.

A technique of a simulation method, which differs from the software simulation using the conventional HDL, and which is suitable for the development of a system including a plurality of modules, is disclosed in the reference "OO-VHDL Object-Oriented Extensions to VHDL" (IEEE Computer, October, 1995, pp. 18–26). The simulation method described in the reference uses a new language in which the features of an object oriented language are incorporated into the conventional HDL, and describes the modules and the connections between the modules. The reference describes that the features of the object oriented language, such as "class" and "inheritance", make the statements and recycling of the modules easy. The reference, however, does not disclose a specific means for applying the simulation method, or the method for describing the modules to a large scale system in which a plurality of various types of circuit modules are connected.

The reference "C++ Simulator [ClassMate] for Actualizing Prior Certification of SOC (the Institute of Electronics, Information, and Communication Engineers, the Technical Report, VLD98-46, 1998-09) discloses a method for the simulation of large scale systems using the C++ language which is an object oriented language. The simulation method and the method for describing the modules, however, do not make use of the advantages of the object oriented language. Therefore, there remains a problem similar to that of the HDL in the recycling of the modules and the connections between the modules.

BRIEF SUMMARY OF THE INVENTION

It is therefore an object of the present invention to provide a method, an apparatus, and a storage medium for simulating a system which can easily and reliably describe the circuit modules and their connections and expand the system and the circuit modules, using the object oriented language, when simulating the system including a plurality of modules using software.

A first aspect of the present invention is directed to the simulation method for simulating a system having a plurality of circuit modules using software. The simulation method uses an object oriented language that prepares a plurality of circuit base classes, which describe base circuit modules as classes, as a library, describes the circuit modules to be simulated as classes by inheriting the circuit base classes prepared as the library, and describes the system to be simulated by combining the circuit modules described as the classes.

A second aspect of the present invention adds to the simulation method by describing the system as a class by inheriting the circuit base classes prepared in the library.

A third aspect of the present invention adds to the simulation method by preparing a component class having the properties of a circuit which contains a circuit operating asynchronously with a clock signal, and a synchronous module class, having the properties of a circuit operating synchronously with the clock signal in the library, which is derived from the component class.

A fourth aspect of the present invention adds to the simulation method by preparing a bus class having the properties of a bus, a bus master class having the properties of a bus master, a bus slave class having the properties of a bus slave, as a circuit base class described as a class derived from the synchronous module class, in the library.

A fifth aspect of the present invention adds to the simulation method by preparing a bus master interface class, whose base classes are the synchronous module class, and which has the properties of a bus master interface, and a bus slave interface class having the properties of a bus slave interface, as the circuit base classes in the library.

A sixth aspect of the present invention adds to the simulation method by preparing a central processing unit class, whose base class is the synchronous module class, and which has the properties of a central processing unit, as the circuit base class in the library.

A seventh aspect of the present invention adds to the simulation method by preparing a hierarchy class, whose base class is the synchronous module class, and which has the properties of a hierarchy of a circuit containing the bus, as the circuit base class in the library.

An eighth aspect of the present invention adds to the simulation method by preparing a memory class, whose base class is the bus slave class, and which has the properties of a memory, as the circuit base class in the library.

A ninth aspect of the present invention is the simulation apparatus, using a computer, which executes the above described method.

A tenth aspect of the present invention is the computer-readable storage medium which stores a computer program for executing the method.

The present invention is characterized by the statements of the simulation model of the system. The present invention uses the object oriented language to describe the system. Therefore, the properties of the circuit modules can be prepared as the class library. A user (designer) can use the inheritance of the properties when describing the circuit modules. The present invention provides the following advantages: (1) it is easy to replace the circuit module, and the connections between the circuit modules are automatically checked, (2) the configuration for displaying the information is commonly used, (3) the configuration for controlling the simulation is commonly used, and (4) it is automatically checked whether the statements of the circuit interfaces are sufficient.

BRIEF DESCRIPTION OF THE DRAWINGS

FIG. 1 is a schematic diagram corresponding to Table 1.

FIG. 3 is a schematic diagram corresponding to the examples in Table 3.

FIG. 7 is a block diagram showing the configuration of the system for explaining the simulation of the data transfer through the bus in an embodiment of the present invention.

FIG. 8 is a diagram showing an example of data to be transferred by the system shown in FIG. 7.

FIG. 10 is a schematic diagram corresponding to Table 25.

FIG. 11 is a schematic diagram corresponding to Table 26.

FIG. 12 is a schematic diagram corresponding to Table 27.

FIG. 13 is a schematic diagram corresponding to Table 28.

FIG. 14 is a schematic diagram corresponding to Table 29

FIG. 15 is a schematic diagram corresponding to Table 30.

DETAILED DESCRIPTION OF THE INVENTION

Figure 1:
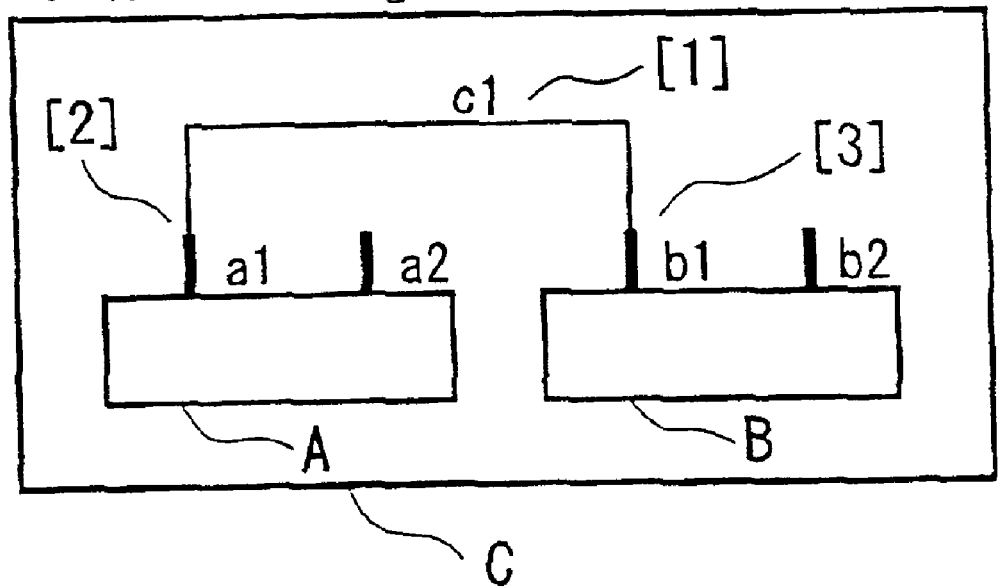
FIG. 1 is a diagram for explaining the example of a circuit system in the conventional HDL.

The embodiment of the simulation method of the present invention will be explained with reference to the figures. In the embodiment, a simulation model is described in the C++ language. The C++ language and the terms used in the description will be defined in the following.

[C++ Language]

The C++ is a programming language, and is classified as an object oriented language. The terms used in the C++ are class, member function (method), object, inheritance, base class, derived class, override (overload), pure virtual function, etc. The class represents a property. The property is described by a member function. The member function defines the operation of the class. The member function is sometimes termed a method. In general, when the ClassX is permitted to perform the operation of a member function Function1, it is called "the ClassX has Function1". The object is an entity which is embodied from a class. When the class ClassX is embodied to obtain the object ObjectX, it is said that "the ObjectX is of the ClassX". The object has properties which are defined in the class. For example, in the example described in the C++ language in Table 2, because ClassA has member functions Function1 and Function2 ([1]), ObjectA has Function1 and Function2 ([2]).

TABLE 2

```
class ClassA{
public:
    void Function1(void){...};      [1]
    void Function2(void){...};      [6]
};
class ClassB : public ClassA{       [3]
public:
    void Function2(void){...};      [7]
    void Function3(void){...};
};
class ClassC{
public:
    virtual void Function1(void)=0; [8]
};
class ClassD: public ClassC{
Public:
    void Function1(void);           [10]
};
main (void) {
    ClassA ObjectA;                 [2]
    ObjectA.Function1();
    ObjectA.Function2();
    ClassB ObjectB;                 [4]
    ObjectB.Function1();
    ObjectB.Function2();
    ObjectB.Function3();
    ClassA *PointerA;               [5]
    PointerA=&ObjectB;
    PointerA->Function1();
    PointerA->Function2();
//PointerA->Function3();
            //Because ClassA does not have Function3,
                    //the compiler outputs an error.
//ClassCObjectC;                    [9]
            //Because ClassC has a pure virtual function,
                    //an object cannot be produced.
            //Therefore, the compiler outputs an error.
ClassD ObjectD;
}
```

The inheritance means that the property of a class is inherited by another class. Specifically, a member function defined in one class is also defined in another class which inherits the class. For example, when producing ClassB inheriting ClassA ([3]), ClassA has the member function Function1, and therefore ClassB tacitly has Function1 even when ClassB does not define Function1 ([4]).

The base class is a class inherited by another class. In the above example, ClassA is the base class of ClassB ([3]). The derived class is a class which inherits another class. In the above example, ClassB is the class derived from ClassA. To define the derived class, as shown in the statement denoted by [3], the name of the derived class (ClassB) is described after a reserved word "class", and subsequently ":public ClassA" (ClassA is the name of the base class) is described. The ":public" is a reserved word which designates the manner of derivation (the way of accessing the member of the base class (public derivation). The object of the derived class can be handled as the object of the base class. For example, ObjectB of ClassB can be handled as the object of ClassA ([5]).

"Override" means re-defining the operation of the member function in the derived class, which has been defined in the base class. For example, in Table2, although ClassA defines the function of the member function Function2 (the portion [6], whose detailed description is omitted), this function is not desired in the derived class ClassB. Accordingly, ClassB redefines the member function Function2 to change the operation of Function2 ([7]). This is termed overriding Function2 in ClassB. When ClassB overrides Function2, the operation of Function2 in ClassB differs from that of A tenth aspect of the present invention; is the computer-readable storage medium which stores a computer program for executing the method. Function2 in ClassA.

A member function whose operation is not defined in the class is termed a pure virtual function ([8], which is described by the expression "[function]=0"). When producing the object of the class having the pure virtual function, the compiling causes an error ([9], where, in Table 2, "//" indicates comments in the C++ language). The virtual pure function is to be overridden in the derived class which inherits and uses the class with the virtual pure function ([10]).

[Premise]

The premise for performing the simulation, that is, using the embodiment will be explained. In general, to construct the system, the system is divided into blocks according to the functions. The blocks are termed circuit modules. The communication between the circuit modules is determined. Then, the circuit modules are separately designed. After the design of all the circuit modules is completed, the circuit modules are assembled into a single system. The system is operated by the communication between the circuit modules. The procedure for the simulation of the system is described below (with reference to FIG. 2).

1. The system which is the simulation target is described in the C++ language.

Figure 2:
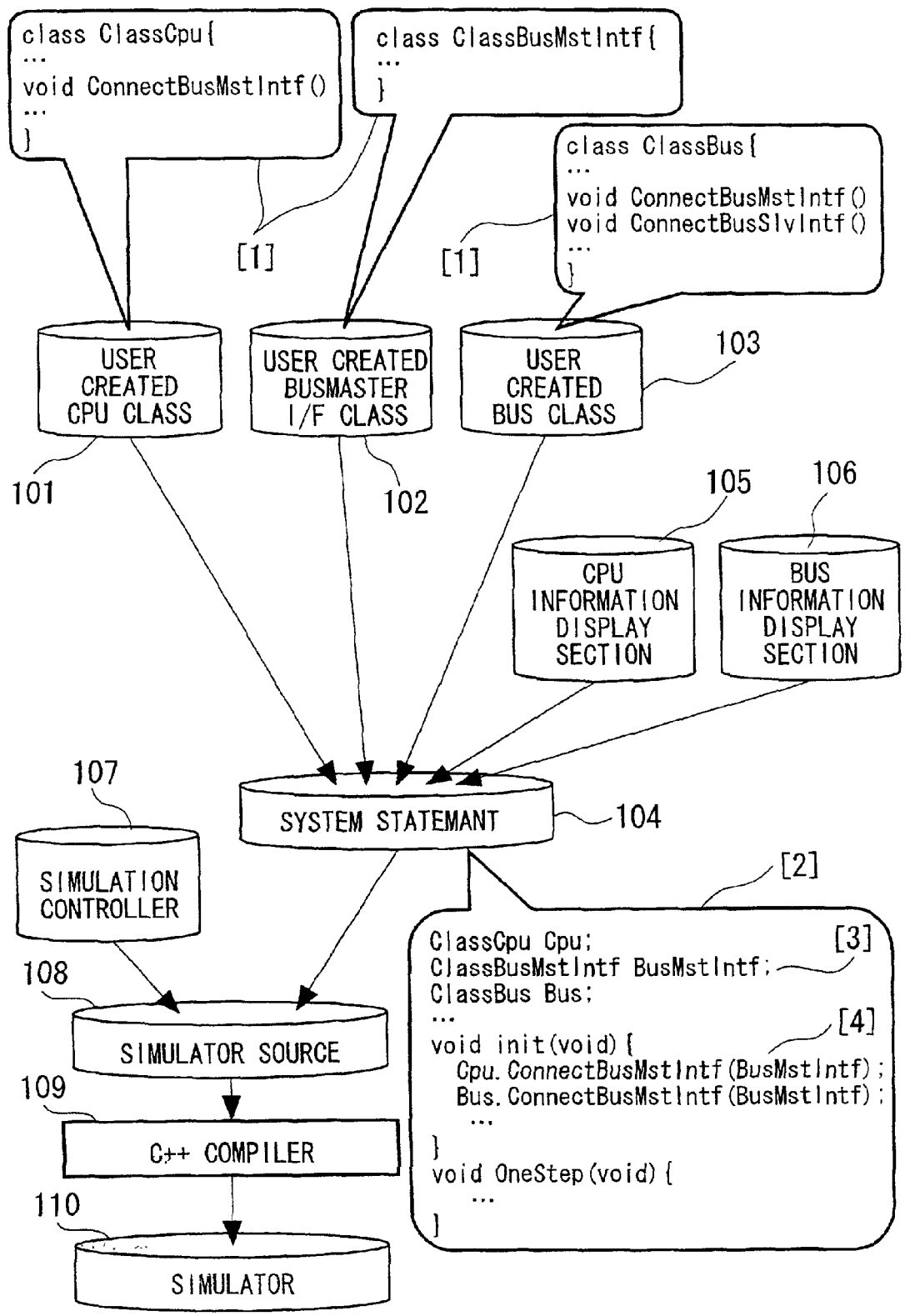
FIG. 2 is a block diagram showing the main configuration of the simulation method (apparatus) of the present invention.

(A) The classes of the circuit modules are declared ([1] in FIG. 2). In the example of FIG. 2, a CPU class 101, a bus master interface class 102, and a bus class 103 are produced as user created classes.

Figure 3:
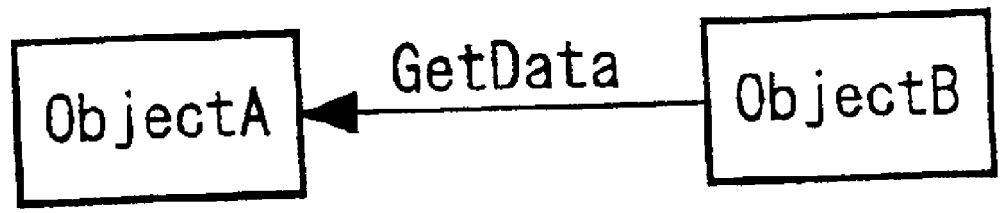
FIG. 3 is a diagram for explaining the system statements shown in FIG. 2.

(B) The simulation model (system statement 104) of the entire system is produced ([2]). The objects of the circuit classes included in the system are produced ([3]). Next, the objects are connected, and the communication between the circuit objects is described. The simulation model of the entire system is thus described ([4]). The connection between the circuit objects is achieved by giving the pointer of a circuit object A to another circuit object B. The communication between the circuit objects is achieved by executing the function of the circuit object A from the circuit object B. Table 3 shows the examples of the statements in the C++ language in which ObjectB receives data indicated by an argument i from ObjectA (GetData), and FIG. 3 is schematic diagram thereof.

TABLE 3

EXAMPLE OF DESCRIPTION IN C++
```
class ClassA {
    ...
    void GetData (int I);
    ...
};
    class ClassB{
        ...
        ClassA *PointerA;
        void ConnectA (ClassA *a)
            {Pointer A=a};
        void OneStep (void) {
            ...
            ... = PointerA->GetData(I);
            ...
        }
    };
```

TABLE 3-continued

```
main () {
    ClassA ObjectA;
    ClassB ObjectB;
    ObjectB.ConnectA (&ObjectA);
    ...
    ObjectB.OneStep();
    ...
}
```

(C) Next, an information display section of the circuit is incorporated. In the prior certifications with simulations, it was necessary to know how the CPU and the bus operate, for example, to know the portion of software the CPU is executing, the variables of the software operating in the CPU, the share of the bus, a master which is using the bus, or the like. The statement of the process for displaying those information is added to the system statement. In FIG. 2, the statement for displaying the information of the bus prepared in advance in a library, and the statement for displaying the information of the bus may be modified if necessary, and are incorporated at appropriate positions in the system statement 104 as a CPU information display section 105 and as a bus information display section 106, respectively.

2. A simulation controller is incorporated.

When executing the simulation, the system can be reset or operated, depending on an instruction from a user. Therefore, a section for controlling the system, depending on the user instructions, is added to the system statement 104 to complete a simulator source 108.

3. The simulation mode (simulator source 108), described in item 2, is compiled by a C++ compiler 109, to thereby obtain the execution type of the simulator (simulator 110).

4. The simulation is executed by the simulator 110.

When the simulation certifies that the system operation is normal, the actual circuit is produced based on the statement in the C++ language.

[Schematic Configuration of the Embodiment of the Invention]

The classes used in the embodiment will be explained. The embodiment prepares the classes, shown in Table 4, as a class library. As shown in Table 4, the embodiment defines a class CmComponent (component class) with the properties common to the entire circuit, a class CmSyncModule (synchronous module class) with the property of the circuit operating synchronously with a clock, a class CmBusMaster (bus master class) with the property of the main section of a bus master, a class CmBusSlave (bus slave class) with the property of the main section of a bus slave, a class CmBusMstIntf (bus master interface class) with the property of bus master interface, a class CmBusSlvIntf (bus slave interface class) with the property of bus slave interface, a class CmBusSystem (bus class) with the property of bus, a class CmCpu (CPU class) with the property of a CPU, a class CmMemory (memory class) with the property of a memory, and a class CmHier (hierarchy class) with the property of a hierarchy of the circuit containing the bus.

TABLE 4

| CLASS | PROPERTY |
| --- | --- |
| CmComponent | general circuit |
| CmSyncModule | circuit operating synchronously with clock |
| CmBusMaster | main section of bus master |
| CmBusSlave | main section of bus slave |
| CmBusMstIntf | bus master interface |

TABLE 4-continued

| CLASS | PROPERTY |
| --- | --- |
| CmBusSlvIntf | bus slave interface |
| CmBusSystem | bus |
| CmCpu | CPU |
| CmMemory | memory |
| CmHier | hierarchy of a circuit containing the bus |

Figure 4:
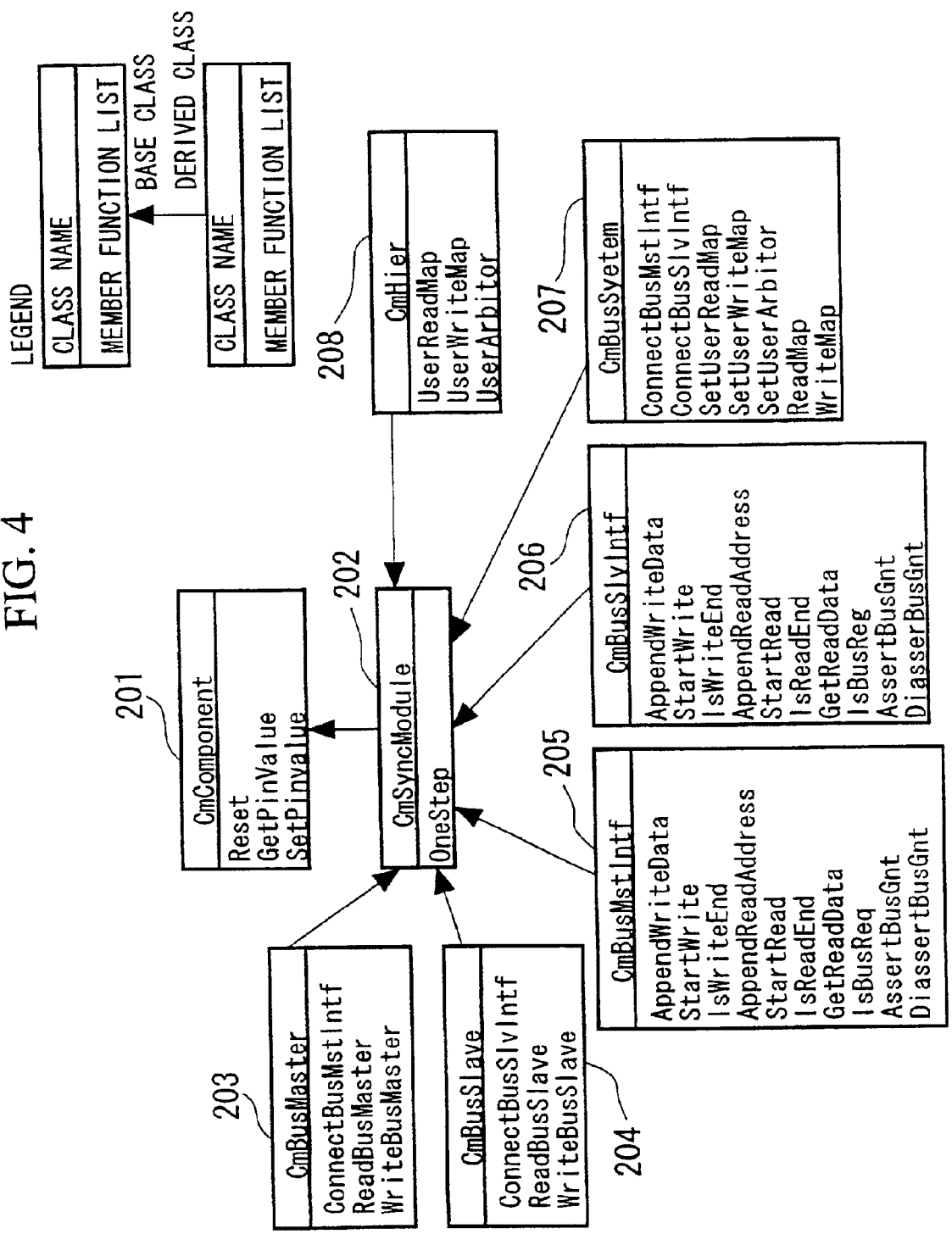
FIG. 4 is a diagram showing the hierarchic relationships between the circuit base classes in the embodiment of the present invention.

In the present invention, the classes, prepared as the library, are termed a circuit base class. The classes have the relationship of inheritance as shown in FIG. 4. In FIG. 4, the class CmSyncModule 202 inherits the class CmComponent 201. The other classes CmBusMaster 203, CmBusSlave 204, CmBusMstIntf 205, CmBusSlvIntf 206, CmBusSystem 207, and CmHier 208 inherit the class CmSyncModule 202. FIG. 4 shows, in addition to the relationship of inheritance between the classes, the list of main member functions of the classes. The details of the member functions will be discussed below. Although not shown in FIG. 4, the class CmCpu (CPU class) inherits the class CmBusMaster 203, and the class CmMemory (memory class) inherits the class CmBusSlave 204.

When dividing the system into the circuit modules, the roles of the respective circuit modules must be decided. Therefore, when describing circuit classes corresponding to the circuit modules, the circuit modules are defined as classes derived from the circuit base classes (as actual circuit classes, or user created classes) by selecting and inheriting the circuit base classes corresponding to the roles from the class library. The circuit classes for performing desired operations are realized by overriding the functions.

The examples of the actual circuit classes are shown in Table 5. In the classes used to create the model of a PCI bus (Peripheral Component Interconnect), the examples are a class CmPciBusMstIntf derived from the circuit base class CmBusMstIntf, a class CmPciBusSlvIntf derived from the circuit base class CmBusSlvIntf, a class CmPciBusSystem derived from the circuit base class CmBusSystem, and a class CmV850 derived from the circuit base class CmCpu used to create the mode of V850 (trademark) CPU.

TABLE 5

| ACTUAL CIRCUIT CLASS | CIRCUIT BASE CLASS |
| --- | --- |
| CmPciBusMstIntf | CmBusMstIntf |
| CmPciBusSlvIntf | CmBusSlvIntf |
| CmPciBusSystem | CmBusSystem |
| CmV850 | CmCpu |

After the circuit classes in the system are created, the system is described as one class. The class of the system contains the objects of the circuit classes created in the above step. Further, the circuit information display section is incorporated in the class of the system. The class of the system selects and inherits the circuit base classes, which are suitable for the properties of the system, from the class library.

Figure 5:
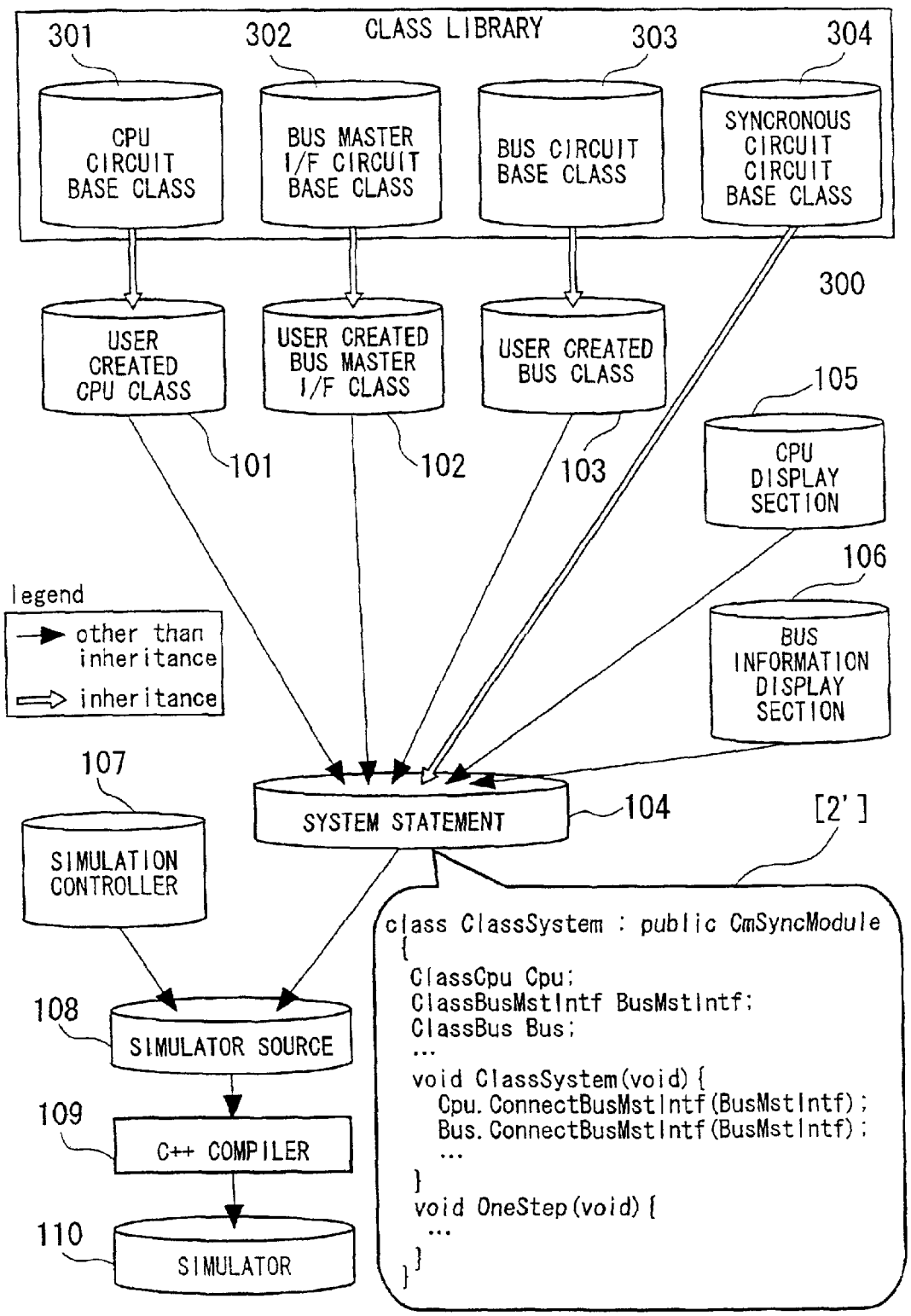
FIG. 5 is a block diagram showing the simulation method (or apparatus) of the present invention.

The method of the simulation of the present invention is described in the following. An example is shown in FIG. 5.

1. The system which is the target of the simulation is described in the C++ language.

(A') The classes of the circuit modules are declared (created) by inheriting the circuit base classes suitable for the respective modules from the class library 300 in which a plurality of circuit base classes have been prepared in advance. In the example shown in FIG. 5, a user created CPU class 101 is declared by inheriting the CPU circuit base class (CmCpu) 301, a user created bus master interface class 102 is declared by inheriting the bus master interface circuit base class (CmBusMstIntf) 302, and a user created bus class 103 is declared by inheriting the bus circuit base class (CmBusSystem) 303.

(B') The class of the system is created by inheriting suitable circuit base class from the class library 300. In the example of FIG. 5, the class is created by inheriting the synchronous circuit circuit base class (CmSyncModule) 304 ([2] in FIG. 5).

(C') Next, the circuit information display section (a CPU display section 105, and a bus information display section 106) are incorporated.

The steps (A'), (B'), and (C') are basically similar to the steps (A), (B), and (C) described in the premise with reference to FIG. 1, except that the classes of the circuit modules and of the system which includes the circuit modules are created by inheriting the circuit base classes defined in the class library 300. In FIG. 5, the reference numerals are employed to denote like parts in FIG. 2.

2. Next, a simulation controller 107 is incorporated to create a simulator source 108.

3. The statement of the item 2 is compiled by the C++ compiler 109 to obtain the execution type of the simulator 110.

4. The simulation is performed by executing the simulator.

In the embodiment, since the system inherits the circuit base class, the system has the properties of the circuit modules. Hence, the system can be used as a circuit module which is to be included in another system. That is, the systems can be described hierarchically. When the system is described hierarchically, the effect of the present invention can be achieved.

[Details of Circuit Base Class]

Next, the circuit base class shown in Table 4 will be explained in detail.

(1) The CmComponent class has the following functions, and is used to describe a combination circuit having no clock.

The CmComponent class has a Reset function. The function is used for asynchronous resetting.

The CmComponent class has a GetPinValue function. The function is executed by a circuit X when the circuit X reads the value of a signal at a terminal of a circuit Y.

The CmComponent class has a SetPinValue function. The function is executed by the circuit X when the circuit X applies a signal to the terminal of the circuit Y.

A Reset function is a pure virtual function. Therefore, the process of the function must be defined in the class which inherits CmComponent. Further, the embodiment provides, in addition to the communication between the circuits through the terminals, the communication through the bus. The communication through the bus is simulated at a high speed by the CmBusMaster class, and the CmBusSlave class. Therefore, the communication which does not use the bus is described with the GetPinValue function and the SetPinValue function.

(2) The CmSyncModule class has the following functions, and is used to describe a sequence circuit which has a clock.

The CmSyncModule class has the Reset function, the GetPinValue function, and the SetPinValue function. The meanings of the functions are the same as those in the CmComponent class.

The CmSyncModule class has a OneStep function. The function is used to perform a one step operation of the circuit. The OneStep function is a pure virtual function. Therefore, the process of this function must be defined in the class which inherits CmSyncModule.

(3) The CmBusMaster class has the following functions, and is used to describe the main section of the bus master. The bus master is used to describe the circuit module which actively drives the bus. The bus master interface, which is referred to in the following description, is a circuit module between the bus and the bus master to absorb the differences between the buses.

The CmBusMaster class has the Reset function, the GetPinValue function, the SetPinValue function, and the OneStep function. The meanings of the functions are the same as those in the CmSyncModule class.

The CmBusMaster class has a ReadBusMaster function. The function reads a value from an object to the bus.

The CmBusMaster class has a WriteBusMaster function. The function writes a value from the bus into an object.

The CmBusMaster class has a ConnectBusMstIntf function. The function is used to connect the bus master interface.

The ReadBusMaster function, and the WriteBusMaster function are pure virtual functions. Therefore, the processes of those functions must be defined in the class which inherits CmBusMaster.

(4) The CmBusSlave class has the following functions, and is used to describe the main section of the bus slave. The bus slave is a circuit module which passively receives data from the bus. In the following description, the bus slave interface is a circuit module between the bus and the bus slave to absorb the differences between the buses.

The CmBusSlave class has the Reset function, the GetPinValue function, the SetPinValue function, and the OneStep function. The meanings of the functions are the same as those in the CmSyncModule class.

The CmBusSlave class has a ReadBusSlave function. The function reads a value from the object to the bus.

The CmBusSlave class has a WriteBusSlave function. The function writes a value from the bus to the object.

The CmBusSlave class has a ConnectBusSlvIntf function. The function is used to connect the bus slave interface.

The ReadBusSlave function, and the WriteBusSlave function are pure virtual functions. Therefore, the processes of those functions must be defined in the class which inherits CmBusSlave.

(5) The CmBusMstIntf class has the following functions, and is used to create the bus master interface. The bus master interface is a circuit module which absorbs the differences between the buses when actively driving the bus.

The CmBusMstIntf class has the Reset function, the GetPinValue function, the SetPinValue function, and the OneStep function. The meanings of the functions are the same as those in the CmSyncModule class.

The CmBusMstIntf class has an IsBusReq function. The function returns whether the bus master interface requests the use of the bus.

The CmBusMstIntf class has an AssertBusGnt function. The function notifies the bus master interface of the permission of the use of the bus from an external circuit (which is normally an arbiter).

The CmBusMstIntf class has a DisassertBusGnt function. The function notifies the bus master interface of the prohibition of the use of the bus from the external circuit (which is normally an arbiter (or arbitor)).

The CmBusMstIntf class has an AppendWriteData function, a StartWrite function, an IsWriteEnd function, an AppendReadAddress function, a StartRead function, an IsReadEnd function, and a GetReadData function. These functions are used to control the class CmBusSystem object from the class CmBusMaster object.

The AppendWriteData function writes an address of the bus slave to which the data is to be written, the data to be written, and the number of bytes of the data to be written, in a predetermined variable area (buffer) in the class. The StartWrite function starts the writing operation of the data to the bus. The IsWriteEnd function returns the result indicating whether the writing operation of the data to the bus is completed. The AppendReadAddress function writes the address of the bus slave from which the data is to be read, and the number of bytes of the data to be read, into the buffer. The StartRead function starts the reading operation of the data from the bus. The IsReadEnd function returns the result indicating whether the reading operation of the data from the bus is completed. The GetReadData function draws the data, which has been read from the bus slave to the buffer, from the buffer.

(6) The CmBusSlvIntf class has the following functions, and is used to describe a circuit module for absorbing the differences between the buses when passively receiving the data from the bus.

The CmBusSlvIntf class has the Reset function, the GetPinValue function, the SetPinValue function, and the OneStep function. The meanings of the functions are the same as those in the CmSyncModule class.

The CmBusSlvIntf class has an IsBusReq function. The function returns whether the bus slave interface requests the use of the bus.

The CmBusSlvIntf class has an AssertBusGnt function. The function notifies the bus slave interface of the permission of the bus from an external circuit (which is normally an arbiter).

The CmBusSlvIntf class has a DisassertBusGnt function. The function notifies the bus slave interface of the prohibition of the use of the bus from the external circuit (which is normally an arbiter).

The CmBusSlvIntf class has an AppendWriteData function, a StartWrite function, an IsWriteEnd function, an AppendReadAddress function, a StartRead function, an IsReadEnd function, and a GetReadData function. The functions are used when the derived class from the CmBusSystem class writes or reads a value to or from the CmBusSlvIntf class. The base functions of those functions are similar to those in the CmBusMstIntf class, except that the target to be written or read is different.

(7) The CmBusSystem class has the following functions. The functions are used to describe a circuit module for transferring the data from the master to the slave.

The CmBusSystem class has the Reset function, the GetPinValue function, the SetPinValue function, and the OneStep function. The meanings of the functions are the same as those in the CmSyncModule class.

The CmBusSystem class has a ConnectBusMstIntf function. The function connects the class, derived from the CmBusMstIntf class, to this object.

The CmBusSystem class has a ConnectBusSlvIntf function. The function connects the class, derived from the CmBusSlvIntf class, to this object.

The CmBusSystem class has a SetUserReadMap function. The function is used to designate a bus read map of the bus. The bus read map is an address map used to read a value from a circuit module through the bus. The bus read map is described as a UserReadMap function in a CmHier class.

The CmBusSystem class has a SetUserWriteMap function. The function is used to designate a bus write map of the bus. The bus write map is an address map which is used to write a value into the circuit module through the bus. The bus write map is described as a UserWriteMap function in the CmHier class.

The CmBusSystem class has a SetUserArbitor function. The function is used to designate an arbiter (or, arbitor) of the bus. The arbiter arbitrates the use right of the bus. This circuit is described as a UserArbitor function in the CmHier class.

The CmBusSystem class has a ReadMap function. The function reads the information from the circuit module through the bus.

The CmBusSystem class has a WriteMap function. The function writes information into the circuit module through the bus.

(8) The CmCpu class inherits the CmBusMaster class, has the following functions, and is used to describe the CPU.

The CmCpu class has the Reset function, the GetPinValue function, the SetPinValue function, the OneStep function, and the ConnectBusMstIntf function. The meanings of the functions are the same as those in the CmSyncModule class.

The CmCpu class has a ConnectBusMstIntf function. The function is used to connect the bus master interface.

The CmCpu class has a GetPc function. The function returns a present value of a program counter.

The CmCpu class has a GetReg function. The function returns the value of a designated register.

The CmCpu class has a SetReg function. The function returns the value of a designated register.

The CmCpu class has a GetData function. The function returns the data stored in a designated address.

The CmCpu class has a SetData function. The function overwrites the data into a designated address.

As described above, the circuit base class CmCpu, which provides the model of the CPU, has the functions defined in the CmBusMaster class by inheriting the circuit base class CmBusMaster which provides the model of the bus master. In addition, the circuit base class CmCpu can display the information from the registers and the program counters on the CPU information display section when executing the program, using the GetPc function, the GetReg function, the SetReg function, the GetData function, and the SetData function.

(9) The CmMemory class inherits the CmBusSlave class, has the following functions, and is used to describe the memory.

The CmMemory class has the Reset function, the GetPinValue function, the SetPinValue function, the OneStep function, and the ConnectBusSlvIntf function. The meanings of the functions are the same as those in the CmBusSlave class.

The CmMemory class has a GetData function. The function returns the data stored in a designated address.

The CmMemory class has a SetData function. The function overwrites the data in a designated address.

(10) The CmHier class inherits the CmSyncModule class, has the following functions, and is used to describe the system which includes the bus.

The CmHier class has the Reset function, the GetPinValue function, the SetPinValue function, and the OneStep function. The meanings of the functions are the same as those in the CmBusSlave class.

The CmHier class has a UserReadMap function. The function is used to describe the bus read map of the bus included in the system. The described bus read map is registered in the bus by the SetUserReadMap function in the CmBusSystem class.

The CmHier class has a UserWriteMap function. The function is used to describe the bus write map of the bus included in the system. The described bus read map is registered in the bus by the SetUserWriteMap function in the CmBusSystem class.

The CmHier class has a UserArbitor function. The function is used to describe the arbiter of the bus included in the system. The described arbiter is registered in the bus by the SetUserArbitor function in the CmBusSystem class.

Next, the examples of the statements of the system for transferring the data through the bus, according to the present invention, will be explained. Before the explanation of the examples of the statements, the address map and the arbiter, mentioned above, will be explained.

The address map is a table indicating the allocation of the circuits to the addresses. The arbiter is a circuit which gives the use right to one of the bus masters requesting the use of the bus. These are well known in general.

First, the address map will be explained.

A number of circuits are connected to the bus. When the data is simply sent to the bus, it cannot be known which circuit is to receive the data as an instruction. Therefore, an address is used to designate one of the circuits. Data and an address are always transferred as a pair through the bus. Further, the circuit which receives the data depends on the predetermined address. The relationships between the addresses and the circuits are defined in the address map.

The transfer of a pair of the data and the address through the bus corresponds to the statement of giving the pair of the data and the address to the UserReadMap function and the UserWriteMap function of the CmHier class. The address map of the embodiment corresponds to the statement of determining the circuit corresponding to the address given to the UserReadMap function and the UserWriteMap function, and of sending the data to the circuit.

The arbiter is needed when two or more bus masters are connected to the bus. The bus simply sends a signal through a signal line. Therefore, when two or more bus masters simultaneously send the signals through the bus, two signals collides in one signal line. Thus, a correct value cannot be transferred to the target circuit module. To avoid this, the arbiter is used. In general, when using the arbiter, the bus master must request the use of the bus to the arbiter. The arbiter, which has received the request from the bus masters, permits one of the bus masters to use the bus. The bus master cannot use the bus until the bus master receives the permission of the use of the bus.

In the embodiment of the present invention, the bus master is divided into the bus master and the bus maser interface. The permission/prohibition of the use of the bus is sent from the arbiter to the bus master interface.

Figure 6:
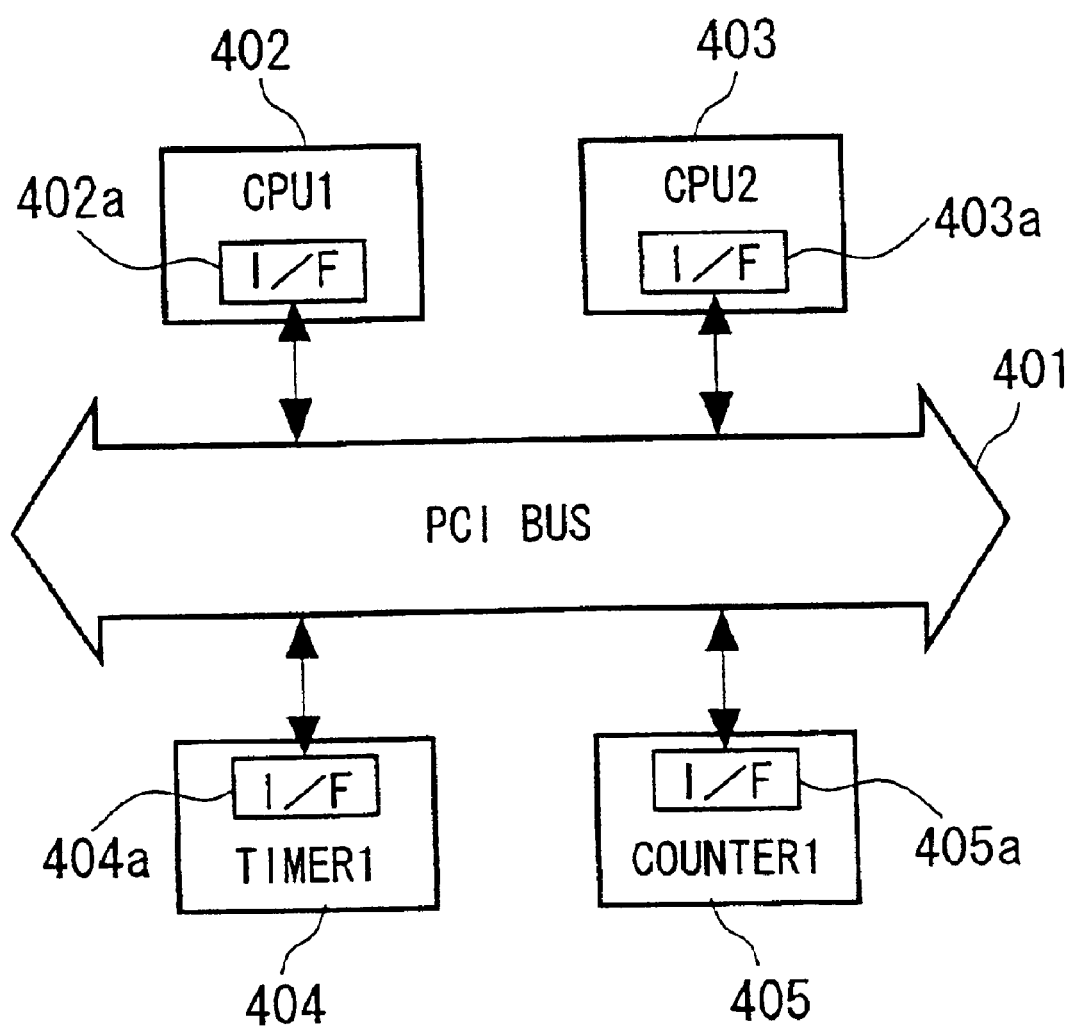
FIG. 6 is a block diagram showing an example of a circuit system for explaining the system statements of the embodiment of the present invention.

The example of the communication of the data through the bus will be explained with reference to Tables 6 to 10. FIG. 6 is a block diagram showing the construction of the system ABC used in the example. Tables 6 to 10 show a series of lists of the statements of the system in the C++ language. Tables 6 to 10 continue in the order of drawing numbers.

As shown in FIG. 6, the system ABC comprises two CPUs (a CPU 1 (402), and a CPU 2 (403)), and a timer 1 (404), and a counter 1 (405), which are connected through a PCI bus 401. The respective CPU 1 (402), the CPU 2 (403), the timer 1 (404), and the counter 1 (405) have interfaces 402a, 403a, 404a, and 405a, each of which includes an interface with the PCI bus 401. Assuming that a plurality of circuits, not shown, are connected to the system ABC of FIG. 6, the positions of the statements of those circuits will be additionally explained in the following explanation of the statement example of the system.

In the system statements shown in Table 6, it is first declared that an object ABC, corresponding to the system ABC, inherits the CmHier class ([1] in Table 6). Next, the PCI bus, corresponding to the PCI bus 401 in FIG. 6, is created as a user created class (actual circuit class) CmPciBusSystem (whose circuit base class is the CmBusSystem class) in the system ABC ([2] in Table 6). As the CPU 1 (402) and the CPU 2 (403) in FIG. 6, two CPUs are created by the CmCpu class of the objects Cpu1 and Cpu2 in the system ABC ([3] in Table 6). Since the objects Cpu1 and Cpu2 are the bus masters, the bus master interface objects Cpu1BusMstIntf and Cpu2BusMstIntf for connecting the objects Cpu1 and Cpu2 to the bus are created ([4] in Table 6, corresponding to the interfaces 402a and 403a in FIG. 6). The bus master interfaces Cpu1BusMstIntf and Cpu2BusMstIntf are created by the user created class CmPciBusMstIntf (whose circuit base class is the CmBusMstIntf class).

TABLE 6

```
class ABC : public CmHier {                              [1]
    // Create a PCI bus in a system ABC.                 [2]
    CmPciBusSystem PciBusSystem;
            // Create two CPU, which are Cpu1,
            // and Cpu2, in the system ABC               [3]
    CmCpu Cpu1, Cpu2;
    // Because Cpu1, and Cpu2 are bus masters,           [4]
    // a bus master interface for connecting Cpu1 and Cpu2 to the bus
    // are created in the system ABC.
    CmPciBusMstIntf Cpu1BusMstIntf, Cpu2BusMstIntf;
    // Create a circuit Timer1 in the system ABC.        [5]
    CmTimer Timer1;
    // Because Timer1 is a bus slave,
    // a bus slave interface for connecting Timer1 to the bus   [6]
    // is created in the system ABC.
    CmPciBusSlvIntf Timer1BusSlvIntf;
    // Create a circuit Counter1 in the system ABC.      [7]
    CmCounter Counter1;
    // Because Counter1 is a bus slave,
    // a bus slave interface
    //for connecting Counter1 to the bus                 [8]
    // is created in the system ABC.
    CmPciBusSlvIntf Counter1BusSlvIntf;
    . . . // Other modules are described (omitted).      [9]
```

Next, a circuit Timer1 corresponding to the timer 1 (404) is created in the system ABC ([5] in Table 6). Since the object Timer1 is the bus slave, a bus slave interface (corresponding to the interface 404a in FIG. 6) for connecting the object Timer1 to the bus is created in the system ABC ([6] in Table 6). Next, a circuit Counter1 corresponding to the counter 1 (405) is created in the system ABC ([7] in Table 6). Since the object Counter1 is a bus slave, a bus slave interface (corresponding to the interface 405a in FIG. 8) for connecting the object Counter1 to the bus is created in the system ABC. The object Timer1 is created, based on the user created class CmTimer1, and the object Counter1 is created, based on the user created class Cmcounter1. The user created classes CmTimer1 and CmCounter1 are derived from the CmBusSlave class. The bus slave interface objects Timer1BusSlvIntf and Counter1BusSlvIntf are declared, based on the derived class CmPciBusSlvIntf from the CmBusSlvIntf class.

The other module is described at the position [9] in Table 6.

Next, the UserBusReadMap function will be described ([1] in Table 7). The UserBusReadMap function describes the bus read map. The return value is a structure RDATA. RDATA.Status is 0 on success, and 1 on failure. Data returns the read value when the reading is successful. ULONG indicates a signal value of 32 bits. The UserBusReadMap decides the circuit from which the value is read, based on the address, and executes the reading function of the bus slave interface of the circuit. First, a variable v having a return value is defined as the structure RDATA ([2] in Table 7).

A statement similar to that of the circuit Timer1 is made for the circuit Counter1 with the read addresses 200 to 300 ([10], and [11] in Table 7). Further, similar statements are made for the other circuits ([12] in Table 7).

The bus write map is described by the UserBusWriteMap function ([1] in Table 8). The return value is int (integer).

TABLE 7

```
// UserBusReadMap describes a bus read map.
// The return value is structure RDATA                [1]
// RDATA.Status returns 0 on success and 1 on failure.
// RDATA.Data returns the read value on success.
// ULONG is a signal value of 32 bits.
RDATA UserBusReadMap(ULONG address, int byte_count) {
    // Based on address, the circuit from which the value is to read is determined.
    // Execute the read function of the bus slave interface of the circuit
            RDATA v;                                   [2]
            // Read values from addresses 100 to 200 into Timer1
            if ((100 <= address) && (address < 200)) { [3]
                // Designate the address to be read    [4]
                Timer1BusSlvIntf.AppendReadAddress (0, address-100, byte_count);
                // Read the value.                     [5]
                Timer1BusSlvIntf.StartRead (0);
                // Check whether the read is successful [6]
                if (Timer1.IsReadEnd(0)) {
            // The reading is successful.              [7]
            v.Status = 0;
            // Extract the read value.                 [8]
            v.Data = Timer1BusSlvIntf.GetReadData(0);
            return v;
                } else {
            // The read failed.                        [9]
            v.Status = 1;
            return v;
                }
            }
            // Read the values from addresses
            // 200 to 300 in Counter1.                 [10]
            else if ((200 <= address) && (address < 300)) {
                // The similar steps as those for
                //Timer1 are repeated in the following. [11]
    } else if . . .
            // The same steps are repeated
            //for the other circuits                   [12]
}
```

Next, a discriminant for reading a value from the circuit (object) Timer1 from addresses 100 to 200 is described ([3] in Table 7). When the discriminant is true, the AppendReadAdress function is executed for the object TimerBusSlvIntf with arguments of 0, address-100, and byte_count, in order to designate the address to be read, and the number of bytes ([4] in Table 7). Next, the StartRead function is executed for the object Timer1BusSlvIntf, to read the value ([5] in Table 7). It is then checked whether the reading has been successful ([6] in Table7). When the reading is successful, v.status is set to 0 ([7] in Table 7), and the GetReadData function is executed for the object Timer1BusSlvIntf, to read the read value and to set v.Data to the read value ([8] in Table 7). When the reading fails, v.Status is set to 1, and the process returns ([9] in Table 7). When executing the AppendReadAddress function, the StartRead function, the IsReadEnd function, and the GetReadData function, the first argument is set to 0, in order to report that these functions are executed by the normal transfer method. The first argument discriminates between a transfer method (Split transfer) switching the master and the slave, and the normal transfer method.

The return value is 0 on success, and 1 on failure in the writing operation. The arguments address and data are signal values of ULONG (32 bits).

TABLE 8

```
// UserBusWriteMap describes a bus write map.         [1]
// The return value is int.
// Returns 0 on success, and 1 on failure.
// ULONG is a signal value of 32 bits.
int UserBusWriteMap(ULONG address, ULONG data,
                int byte_count) {
    // Write a value, based on address.               [2]
    // Determine a circuit, and execute the write function
    // of the bus slave interface of the determined circuit.
        // Write the values into addresses 100 to 200 of Timer1 [3]
        if ((100 <= address) && (address < 200)) {
            // Designate the address into
            //which the value to be written.          [4]
            Timer1BusSlvIntf.AppendWriteData (0, address-100,
data, byte_count);
            // Write the value.                       [5]
            Timer1BusSlvIntf.StartWrite (0);
            // Check whether the write is successful. [6]
            If (Timer1.IsWriteEnd(0)) {
```

TABLE 8-continued

```
        // The write is successful.                                    [7]
        return 0;
                } else {
        //The write failed.                                            [8]
        return 1;
                }
        }
        // Write the values into the
        //addresses 250 to 350 from Counter1.                          [9]
        //The addresses are different between the reading and the
writing.
                else if ((250 <= address) && (address < 350)) {
                        // In the following, the similar steps to those for
//Timer1 are repeated.                                                 [10]
                } else if . . .
        // The similar steps are repeated for the other circuits.     [11]
        }
```

The circuit into which the values are to be written is determined, and the writing function of the bus slave interface of the determined circuit is executed ([2] in Table 8). The values are written into the addresses 100 to 200 of the circuit Timer1 ([3] in Table 8). The AppendWriteData function is executed for the object Timer1BusSlvIntf with the arguments 0, (address-100), data, and byte_count, to designate the data to be written ([4] in Table 8). Then, the StartWrite function is executed to write the value ([5] in Table 8). The IsWriteEnd function is executed for the circuit Timer1 to check whether the writing has been successful ([6] in Table 8). When the writing has been successful, the return value is 0. When the writing has failed, the return value is 1. When executing the AppendWriteData function, the StartWrite function, and the IsWriteEnd function, the first argument is set to 0 in a similar manner to the execution of the AppendReadAdress function, to report that those functions are executed by the normal transfer method.

The circuit Counter1 will be explained. From addresses 250 to 350, the circuit Counter1 is stated in a manner similar to the circuit Timer1 ([9], [10] in Table 8). The other circuits are stated in a similar way ([11] in Table 8).

Next, the operation of the arbiter in the UserArbitor function is described ([1] in Table 9). The return value of the UserArbitor function is void. The permission of the use of the bus is directly given to the bus master interface. The IsBusReq function is executed for the objects Cpu1BusMstIntf and Cpu2BusMstIntf, to directly draw the request, to use the bus, from the bus master interfaces ([2] in Table 9). The request from the object Cpu1 is preferred to that from the object Cpu2, and the preference of the requests is checked ([3] in Table 9). When the Cpu1 requests to use the bus, the Cpu1 can use the bus even if the Cpu2 requests to use the bus. That is, the AssertBusGnt function is executed for the object Cpu1BusMstIntf, and the DiassertBusGnt function is executed for the object Cpu2BusMstIntf, to allow the Cpu1 to use the bus and to reject the use of the bus by Cpu2 ([4] in Table 9).

TABLE 9

```
        // UserArbitor describes an arbiter.                           [1]
        // The return value is void (no return value).
        // The permission to use the bus is directly given to the bus master
interface.
                void UserArbitor(void) {
                        // The request to use the bus is directly extracted
                                //from the bus master interface.       [2]
                        int Cpu1BusReq = Cpu1BusMstIntf.IsBusReq();
                        int Cpu2BusReq = Cpu2BusMstIntf.IsBusReq();
                        // Cpu1 is preferred to Cpu2.                  [3]
                        if (Cpu1BusReq) {
                                // Allow Cpu1 to use the bus when
                //Cpu1 requests to use the bus                         [4]
                                // even if the Cpu2 requests to use the bus
                                Cpu1BusMstIntf.AssertBusGnt();
                                Cpu2BusMstIntf.DiassertBusGnt();
                        } else if (Cpu2BusReq) {
                                // Only when Cpu1 does not use the bus,
                                // Cpu2 can use the bus.               [5]
                                Cpu1BusMstIntf.DiassertBusGnt();
                                Cpu2BusMstIntf.AssertBusGnt();         [6]
                        } else {
                                Cpu1BusMstIntf.DiassertBusGnt();
                                Cpu2BusMstIntf.DiassertBusGnt();       [7]
                        }
                }
```

When the object Cpu1 does not use the bus, and when the object Cpu2 is to use the bus ([5] in Table 9), the Cpu1 is prohibited from using the bus, and the Cpu2 is allowed to use the bus ([6] in Table 9). When neither of the objects sends the request, both the objects are prohibited from using the bus ([7] in Table 9).

Next, the operation and connection of the system ABC is described in the function ABC(void) ([1] in Table 10). The function ABC(void) is a function (constructor: the function whose name is the same as that of the class) called to create the object of the system ABC. The circuits and the bus interfaces are connected by the ConnectBusMstIntf function, or the ConnectBusSlvIntf function, and the bus interfaces and the PCI bus are connected by the ConnectBusMstIntf function ([2] in Table 10). At that time, the addresses of the bus interface objects of the respective circuits are used as the arguments, to thereby connect the PCI bus to the respective circuits. The other circuits are described in the same manner ([3] in Table 10).

TABLE 10

```
        // ABC (void) is a function (constructor)
        // when creating the object of the system ABC.                 [1]
        ABC (void) {
                // Connect the bus with the circuits.                  [2]
                Cpu1.ConnectBusMstIntf(&Cpu1BusMstIntf);
                Cpu2.ConnectBusMstIntf(&Cpu2BusMstIntf);
                Timer1.ConnectBusSlvIntf(&Timer1BusSlvIntf);
                Counter1.ConnectBusSlvIntf(&Counter1BusSlvIntf);
                PciBusSystem.ConnectBusMstIntf(&Cpu1BusMstIntf);
                PciBusSystem.ConnectBusMstIntf(&Cpu2BusMstIntf);
                PciBusSystem.ConnectBusSlvIntf(&Timer1BusSlvIntf);
                PciBusSystem.ConnectBusSlvIntf(&Counter1BusSlvIntf);
                . . . // Describe the other circuits (omitted).        [3]
                // Designate an address map. Register the created address map
                // in PciBusSystem. Thus, PciBusSystem can use         [4]
                // the created address map.
```

TABLE 10-continued

```
        PciBusSystem.SetUserReadMap (UserReadMap);
        PciBusSystem.SetUserWriteMap (UserWriteMap);
    }
    // OneStep describes the operation of the system ABC      [5]
    // within one unit time.
    void OneStep (void) {
        // The system ABC is operated by the arbitrary behaviors of the
components.                                                   [6]
        // Accordingly, in the level of the system ABC,
        // the respective components in the system are simply operated in
one unit time.
        PciBusSystem.OneStep();                               [7]
        // Although the bus does not require the clock because the bus is
signal lines,
        // the clock is given to the bus in order to extract data
        // synchronously with the clock for debugging.
        Cpu1BusMstIntf.OneStep();                             [8]
        Cpu2BusMstIntf.OneStep();
        Timer1BusSlvIntf.OneStep();
        Counter1BusSlvIntf.OneStep();
        Cpu1.OneStep();
        Cpu2.OneStep();
        Timer1.OneStep();
        Counter1.One Step();
        . . . // The other circuits are operated.             [9]
    }
}
```

The SetUserReadMap function and the SetUserWriteMap function designate the address map for the object PciBusSystem ([4] in Table 10). By the execution of the functions, the address map is registered in the object PciBusSystem. Thus, the PciBusSystem can use the address map.

Next, the operation of the system ABC in one unit time is described by the OneStep function ([5] in Table 10). The system ABC is operated by the arbitrary behaviors of the components. Accordingly, in the level of the system ABC, the respective components in the system are simply operated in one unit time ([6] in Table 10 (comments)). The OneStep function is executed for the PCI bus PciBusSystem ([7] in Table 10). Although the bus does not require the clock because the bus is a signal line, the embodiment gives the clock to the bus in order to extract data synchronously with the clock in a debugging function. Next, the OneStep function is executed for the objects Cpu1BusMstIntf, Cpu2BusMstIntf, Timer1BusSlvIntf, Counter1BusSlvIntf, Cpu1, Cpu2, Timer1, and Counter1, to operate them in one unit time ([8] in Table 10). In a similar way, the OneStep function is executed for the other circuits ([9] in Table 10).

Thus, the statements of the system ABC are completed. In the embodiment, the bus connecting the modules are divided into the bus system, and the bus master interface, or the bus slave interface. Further, the objects (circuit modules) are described using the inheritance. Thus, the connection interface between the objects in the system can be described in integrated form.

[Header Files in Circuit Base Class]

Next, the header files of the main circuit base classes will be explained with reference to Tables 11 to 20. In the figures, the comment lines with "//" explain the details of the statements. In the statements, the functions with "virtual" and "=0", such as "virtual void Reset(void)=0;" (e.g., Table 11) are pure virtual functions, which means that the functions must be defined in the classes which inherit those classes. In the figures, the details of the statements of the functions are omitted, but only the comment lines remain for the better understanding. The contents of the figures will be explained in the followings.

TABLE 11

```
class CmComponent {
    // Usage: describe a sequence circuit with a clock.
    public:
        virtual void Reset(void) = 0;
            // Usage: asynchronous resetting.
        virtual RDATA GetPinValue(int no) {
            // Usage: return the signal value at the terminal number "no".
        }
        virtual int SetPinValue(int no, ULONG data);
            // Usage: apply data at the terminal number "no".
        }
};
```

Table 11 shows the statements which define the CmComponent class. In the class CmComponent, the Reset function is defined as a pure virtual function. Table 12 shows the statements of the CmSyncModule class which is the derived class from the CmComponent class. In the CmComponent class, the OneStep function is defined as a pure virtual function. The CmSyncModule class is the derived class from the CmComponent class. Because the CmSyncModule class does not override the functions in the CmComponent class, the definitions of the functions in the CmComponent class are used as they are.

TABLE 12

```
class CmSyncModule : public CmComponent {
    // Usage: describe a sequence circuit having a clock.
    // Note: CmSyncModule uses Reset, GetPinValue, and SetPinValue
    //      defined in CmComponent as are.
    public:
        virtual void OneStep(void) = 0;
            // Usage: operate the circuit by one step.
};
```

Table 13 shows the statements of the CmBusMaster class which is the derived class from the CmSyncModule class. Table 14 shows the definition of the CmBusSlave class which the derived class from the CmSyncModule class. Tables 14 and 15 show the definitions of the CmBusMstIntf class which is the derived class of the CmSyncModule class. In the definition of the CmBusMstIntf class, the operation of the circuit by one step is described by the virtual function of "virtual void OneStep(void) {. . . }", shown in Table 16, which overrides the OneStep function defined in the CmSyncModule class. The arguments of the AppendWriteData function, the StartWrite function, the IsWriteEnd function, and the AppendReadAddress function, which are shown in Table 15, and the StartRead function, the IsReadEnd function, and the GetReadData function, which are shown in Table 16, are set to an integer variable mode, to thereby enable the operation of the transfer method (split transfer) which switches the master and the slave. Tables 17 and 18 show the definitions of the CmBusSlvIntf class which is the derived class from the CmSyncModule class. Table 19 shows the definition of the CmBusSystem class which is the derived class from the CmSyncModule class. Table 20 shows the definition of the CmHier class which is the derived class from the CmSyncModule class.

TABLE 13

```
class CmBusMaster : public CmSyncModule {
// Usage: describe the main section of the bus master.
public:
    virtual void ConnectBusMstIntf(CmBusMstIntf *bus_mst_intf) {
        // Usage: connect the circuit to the bus master interface.
    }
    virtual RDATA ReadBusMaster(ULONG address,
        int byte_count) = 0;
        // Usage: read a value from the circuit to the bus.
    virtual int WriteBusMaster(ULONG address, ULONG data,
        int byte_count) = 0;
        // Usage: write a value from the object into the bus.
};
```

TABLE 14

```
class CmBusSlave : public CmSyncModule {
// Usage: describe the main section of the bus slave.
public:
    virtual void ConnectBusSlvIntf(CmBusMstIntf *bus_mst_intf) {
        // Usage: connect the circuit to the bus slave interface.
    }
    virtual RDATA ReadBusSlave(ULONG address, int byte_count) = 0;
    // Usage: read the value from the circuit to the bus.
    virtual int WriteBusSlave(ULONG address, ULONG data,
int byte_count) = 0;
    // Usage: write the value from the bus into the object.
};
```

TABLE 15

```
class CmBusMstIntf : public CmSyncModule {
// Usage: create a bus master interface.
public:
    virtual bool IsBusReq(void) {
        // Usage: returns a value indicating whether the bus master
interface requests
        //       to use the bus.
    }
    virtual void AssertBusGnt(void) {
        // Usage: notify the bus master interface of the permission use
the bus,
        //    which is sent from an external circuit (normally, the
arbiter).
    }
    virtual void DiassertBusGnt(void) {
        // Usage: notify the bus master interface of the rejection to use
the bus,
```

TABLE 15-continued

```
        // which is sent from an external circuit (normally, the
arbiter).
    }
    virtual void AppendWriteData(int mode, ULONG address,
                                ULONG data, int byte_count) {
        // Usage: when mode is 0, register address
        // which is to be written into the circuit module through the
bus, data, and
        // the number of bytes byte_count, in the buffer of the circuit
    }
    virtual void StartWrite(int mode) {
        // Usage: when mode is 0, start writing data into the bus.
    }
    virtual bool IsWriteEnd(int mode) {
        // Usage: when mode is 0, return a value
        // indicating whether the writing is completed.
    }
    virtual void AppendReadAddress(int mode,
                                ULONG address, int byte_count) {
        // Usage: when mode is 0, register address
        // which is to be written into the circuit module through the
bus, data, and
        // the number of bytes byte_count, in the buffer of the circuit
    }
```

TABLE 16

```
(continued from the definition of class CmBusMstIntf)
    virtual void StartRead(int mode) {
        // Usage: when mode is 0, start reading the data from the bus.
    }
    virtual bool IsReadEnd(int mode) {
        // Usage: when mode is 0, return a value
        // indicating whether the reading operation from the bus is
completed.
    }
    virtual ULONG GetReadData(int mode) {
        // Usage: when mode is 0, and when the reading from the bus is
completed,
        //    extract one data which has been read and stored in the
buffer
        //    return the data to the bus master.
    }
    virtual void OneStep(void) {
        // Usage: operate the circuit by one step.
        // Operation: while in the reading or writing operation
        // from the bus master to the bus, extract one data, to be read
or written,
        // from the buffer, and sent it to the bus. When the buffer
becomes empty,
        // the reading or writing is completed.
        // Supplement: OneStep function defined in CmSyncModule is
overridden.
    }
};
```

TABLE 17

```
classCmBusSlvIntf : public CmSyncModule {
    public:
    virtual book IsBusReq(void) {
        // Usage: return a value indicating whether the bus slave
interface
        // requests to use the bus.
    }
    virtual void AssertBusGnt(void) {
        // Usage: the external circuit (normally, the arbiter) notifies
the bus slave
        // interface of the permission to use the bus.
    }
    virtual void DiassertBusGnt(void) {
        // Usage: the external circuit (normally, the arbiter) notifies
the bus slave
        // interface of the prohibition to use the bus.
    }
```

TABLE 17-continued

```
virtual void AppendWriteData(int mode, ULONG address,
                             ULONG data, int byte_count) {
    // Usage: when mode is 0, register address
    // which is to be written into the bus slave, data, and
    // the number of bytes byte_count, into the buffer of the circuit
}
virtual void StartWrite(int mode) {
    // Usage: when mode is 0, write the data into the bus slave,
based on the data
    // registered in the buffer.
}
virtual bool IsWriteEnd(int mode) {
    // Usage: when mode is 0, return a value indicating whether the
writing operation
    // into the bus slave completed.
}
virtual void AppendReadAddress(int mode, ULONG address,
                               int byte_count) {
    // Usage: when mode is 0, the address, which is to be read from
the bus slave,
    // and the number of bytes byte_count into the buffer in the
circuit.
}
```

TABLE 18

```
(continued from the definition of class CmBusSlvIntf)
    virtual void StartRead(int mode) {
        // Usage: when mode is 0, read the data from the bus slave,
        // based on the data registered in the buffer.
    }
    virtual bool IsReadEnd(int mode) {
        // Usage: when mode is 0, return a value indicating whether
        // the reading operation from the bus slave is completed.
    }
    virtual ULONG GetReadData(int mode) {
        // Usage: when mode is 0, and when the reading operation from
the bus slave
        // is completed, extract one data which has been read from the
bus slave
        // and has been stored in the buffer, and return it to the bus.
    }
    virtual void OneStep(void) {
        // Usage: operate the circuit by one step.
        // Operation: OneStep does not perform operation
        // in connection with the bus slave.
        // Supplement: CmBusSlvInt overrides OneStep defined in
SyncModule.
    }
};
```

TABLE 19

```
class CmBusSystem : public CmSyncModule {
public:
    virtual void ConnectBusMstIntf(CmBusMstIntf *bus_mst_intf) {
        // Usage: connect the bus master interface to the bus.
    }
    virtual void ConnectBusSlvIntf(CmBusSlvIntf *bus_slv_intf) {
        // Usage: connect the bus slave interface to the bus.
    }
    virtual void SetUserReadMap(CmHier *hier) {
        // Usage: designate a bus read map. When sending the object of
        // CmHier class, the UserReadMap function of CmHier object is
        // registered as the bus read map of the bus.
    }
    virtual void SetUserWriteMap (CmHier *hier) {
        // Usage: designate a bus write map. When sending the object of
        // CmHier class, the UserWriteMap function of CmHier object is
        // registered as the bus write map of the bus.
    }
```

TABLE 19-continued

```
    virtual void SetUserArbitor(CmHier *hier) {
        // Usage: designate an arbiter. When sending the object of
        // CmHier class, the UserArbitor function of CmHier object is
        // registered as the arbiter of the bus.
    }
    virtual RDATA ReadMap(ULONG address, int byte_count) {
        // Usage: read data from a circuit module through the bus.
        // Based on the given address, the circuit which is the target to
be read
        // is determined. The data of the number of bytes byte_count are
        // read from the circuit module, and the read data is returned.
    }
    virtual int WriteMap(ULONG address, ULONG data,
int byte_count) {
        // Usage: write data into a circuit module through the bus.
        // Based on the given address, the circuit to which the data is
to be written
        // is determined. The data of the number of bytes byte_count are
        // written into the circuit module, and a value indicating
whether
        // the writing is successful is returned.
    }
    virtual void OneStep(void) {
        // Usage: operate the bus arbiter by one step.
        // Operate the information display function of the bus.
        // Supplement: because the bus is a simple signal line,
        // the bus does not operate in response to the clock.
    }
};
```

TABLE 20

```
class CmHier : public CmSyncModule {
    virtual RDATA UserReadMap(ULONG address, int byte_count) {
        // Usage: describe the bus read map of the bus included in the
system.
    }
    virtual int UserWriteMap(ULONG address, ULONG data,
                             int byte_count) {
        // Usage: describe the bus write map of the bus included in the
system.
    }
    virtual void UserArbitor(void) {
        // Usage: describe the arbiter of the bus included in the system.
    }
}
```

[Bus Simulation Method]

Next, the bus simulation method, that is, the specific simulating operation will be schematically explained. The basic policy of the bus simulation is explained in the following.

The bus master leaves the complicated control of the bus to the bus master interface. The bus master registers all the data, to be written or read, into the buffer in the bus master interface instantly.

The communication from the bus master interface to the bus slave is executed whenever the OneStep function is executed.

When the OneStep function is called, the bus master interface extracts the data units one by one from the buffer, and sends it to the bus.

The bus determines the target bus slave to be written or read, based on the bus read map, or on the bus write map, and sends a read or write command to the bus slave interface corresponding to the determined bus slave.

The bus slave interface writes or reads data in the bus slave, depending on the instruction sent from the bus, and returns the result to the bus.

The bus returns the result, sent from the bus slave interface, to the bus master interface.

The bus master interface decides the operation in the next OneStep function, based on the result sent from the bus.

Next, the flow of the execution of the functions in the embodiment will be explained by way of the example of writing data. In the system X shown in FIG. 7, a bus master A1, a bus master interface B1, a bus C1, a bus slave interface D1, and a bus slave E1 are connected in alphabetical order. The system is to write two pairs of units of information (address/data/bytes, 0x00100000/0x00112233/4, and 0x00100004/0x44556677/4), which are shown in FIG. 8, from the bus master A1, e.g., a CPU, into the bus slave E1, e.g., a memory.

The statements of the system X, the bus master A1, the bus master interface B1, the bus C1, the bus slave interface D1, and the bus slave E1 inherits the properties of the classes described above. That is, the system X inherits the CmSyncModule class, the bus master A1 inherits the CmBusMaster class, the bus master interface B1 inherit the CmBusMstIntf class, the bus C1 inherits the CmBusSystem class, the bus slave interface D1 inherit the CmBusSlvIntf class, and the bus slave E1 inherits the CmBusSlave class. These components are created by directly inheriting the classes, or by inheriting classes which inherit those classes. According to the UserWriteMap function in the system X, the addresses 0x00100000 and 0x00100004 correspond to the bus slave interface D1. When constructing the system X, the SetUserWriteMap function of the bus C1 is executed, so that the UserWriteMap function of the system X is registered as the bus write map of the bus C1. The OneStep function for operating the bus master A1, the bus master interface B1, the bus C1, the bus slave interface D1, and the bus slave E1 by one step is always called from the OneStep of the system X.

Figure 9:
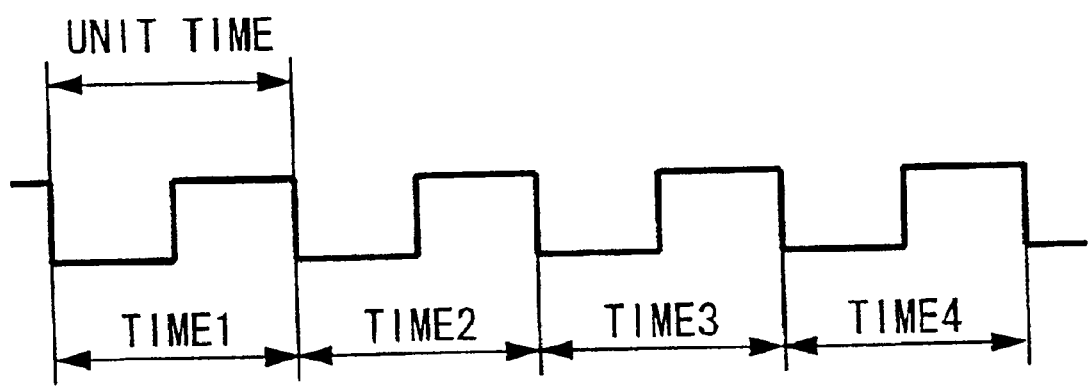
FIG. 9 is a timing chart showing the timings of the operations for explaining the simulation of the data transfer through the bus by the system of FIG. 7 according to an embodiment of the present invention.

In the above construction, the operation of the system X in unit times 1 to 4, shown in FIG. 9, will be explained with reference to Tables 21 to 24.

[Time 1]

The operation of the system X in the time 1 will be explained with reference to Table 21. Table 21 shows the operations of the respective circuits in the manner of a time series within the same unit time (time 1). In the time 1, the OneStep function of the bus master A1 is executed. The bus master A1 executes the function AppendWriteData (0, 0x00100000, 0x00112233, 4) of the bus master interface B1. Then, the bus master interface B1 stores the data in the buffer. Then, the bus master A1 executes the function AppendWriteData (0, 0x00100004, 0x44556677, 4) of the bus master interface B1. The bus master interface B1 stores the data in the buffer. The bus master executes the StartWrite function of the bus master interface B1. The bus master interface B1 memorizes the write request. The bus master A1 executes the IsWriteEnd function of the bus master interface B1 is writing the data, to the bus master A1. The bus master A1 then goes on standby.

TABLE 21

```
# time1
    OneStep of A1
        A1 executes AppendWriteData(0,0x00100000,0x00112233,4) of B1.
            B1 stores the data into the buffer.
        A1 executes AppendWriteData(0,0x00100004,0x44556677,4) of B1.
            B1 stores the data into the buffer.
        A1 executes StartWrite(0) of B1.
            B1 memorizes the write request.
        A1 executes IsWriteEnd(0) of B1.
            B1 returns a value indicating that B1 is writing the data.
        A1 stays on standby.
    OneStep of B1
        Because B1 is requested by A1 to write the data, B1 requests to
use the bus.
            When the IsBusReq function of the bus master interface B1 is
            externally executed, the return value is true.
    OneStep of C1
        Operate the arbiter.
            Arbiter executes IsBusReq() of B1.
                B1 returns that B1 is requesting to use the bus.
            Arbiter permits B1 to use the bus.
            Arbiter executes AssertBusGnt() of B1.
                B1 memorizes the permission to use the bus.
    OneStep of D1
        no operation
    OneStep of E1
        The special operation of the bus slave E1 is performed,
        but does not includes an operation in connection with the bus.
time
```

When the OneStep function of the bus master A1 is completed, the OneStep function of the bus master interface B1 is executed. Since the bus master interface B1 has received the write request from the bus master A1, the bus master interface B1 requests the use of the bus. Accordingly, when the IsBusReq function of the bus master interface B1 is externally executed, the return value is true. Then, the OneStep function of the bus master interface B1 is completed.

When the OneStep function of the bus master interface B1 is completed, the OneStep function of the bus C1 is executed. The OneStep function of the bus C1 operates the arbiter. The arbiter executes the IsBusReq function of the bus master interface B1. The bus master interface B1 returns the request to use the bus. If the arbiter permits the bus master interface B1 to use the bus, the arbiter executes the AssertBusGnt function of the bus master interface B1. The bus master interface B1 memorizes the permission to user the bus. Then, the OneStep function of the bus C1 is completed.

When the OneStep function of the bus C1 is completed, the OneStep function of the bus slave interface D1 is executed. In the time 1, the OneStep function of the bus slave interface D1 is completed without the execution of any process.

When the OneStep function of the bus slave interface D1 is completed, the OneStep function of the bus slave E1 is executed. The special operation of the bus slave E1 is performed, but does not includes the operation in connection with the bus.

[Time 2]

Next, the operation of the system X in the time 2, which is the next unit time, will be explained with reference to Table 22. In the time 2, the OneStep function of the bus master A1 is executed in a manner similar to that in the time 1. The bus master A1 executes the IsWriteEnd function of the bus master interface B1. The bus master interface B1 returns the value indicating that the bus master interface B1 is writing the data. Then, the bus master A1 then goes on standby.

TABLE 22

```
#time2
    OneStep of A1
        A1 executes IsWriteEnd(0) of B1.
            B1 returns that B1 is writing the data.
        A1 stays on standby.
    OneStep of B1
        Because B1 is permitted to use the bus, B1 writes the data into
the bus.
        That is, the following operations are performed.
            B1 extracts one data from the buffer.
                address:0x00100000 data:0x00112233 number of bytes:4
            B1 executes WriteMap(0x00100000,0x00112233,4) of C1.
                WriteMap function of C1 executes the following operations.
                    Execute AppendWriteData (0,0x00100000,0x00112233,4)
                    function of D1.
                        D1 stores the given data into the buffer.
                    D1 executes StartWrite(0) function.
                        D1 executes WriteBusSlave (0x00100000,0x00112233,4)
                        function of E1.
                            E1 internally writes the given data, and returns a
value,
                            indicating whether the writing is successful, to D1.
                            In the example, the writing is successful.
                    Execute IsWriteEnd(0) function of D1.
                        Because the writing operation by D1 into E1 is
successful,
                        the value is true.
                    Return the return value of IsWriteEnd(0) function D1.
            B1 comes to know that the data has been successfully written,
            based on the return value.
            Then, B1 deletes one data from the buffer.
            Because B1 stores one data, the same process is performed
            in the next OneStep of B1.
    OneStep of C1
        no operation
    OneStep of D1
        no operation
    OneStep of E1
        The special operation of the bus slave E1 is performed,
        but does not includes an operation in connection with the bus.
Time
```

When the OneStep function of the bus master A1 is completed, the OneStep function of the bus master interface B1 is executed. Since the OneStep function of the bus master interface B1 permits the bus master interface B1 to use the bus, the bus master interface B1 writes the data into the bus. That is, the following operation is performed. The bus master interface B1 extracts one data unit from the buffer. At that time, the address is 0x00100000, the data is 0x00112233, and the number of bytes is 4. Then, the bus master interface B1 executes the function WriteMap (0x00100000, 0x001122333, 4) of the bus C1.

Then, the WriteMap function of the bus C1 performs the following operations. The function AppendWriteData (0, 0x00100000, 0x00112233, 4) of the bus slave interface D1 is executed. The bus slave interface D1 stores the given data into the buffer. The StartWrite function of the bus slave interface D1 is executed. The bus slave interface D1 executes the function WriteBusSlave (0x00100000, 0x00112233, 4) of the bus slave E1. The bus slave E1 stores the given data into the buffer. The bus slave E1 returns the value indicating whether the writing has been successful, to the bus slave interface D1. In the example, the writing has been successful. The IsWriteEnd function of the bus slave interface D1 is executed. Because the writing of the data into the bus slave E1 by the bus slave interface D1 has been successful, the return value is true. Thus, the return value of the IsWriteEnd function of the bus slave interface D1 is returned.

The bus master interface B1 comes to know, based on the return value, that the data has been successfully written. Then, one unit of the data is deleted from the buffer. Since one data unit remains in the buffer of the bus master interface B1, the same operation is performed in the next OneStep of the bus master interface B1.

When the OneStep function of the bus master interface B1 is completed, the OneStep function of the bus C1 is executed. In the time 2, the OneStep function of the bus C1 executes nothing.

When the OneStep function of the bus C1 is completed, the OneStep function of the bus slave interface D1 is executed. In time 2, the OneStep function of the bus slave interface D1 executes nothing.

When the OneStep function of the bus slave interface D1 is completed, the OneStep function of the bus slave E1 is executed. The special operation of the bus slave E1 is performed, but does not includes the operation in connection with the bus.

[Time 3]

In the time 3, as shown in Table 23, the OneStep function of the bus master A1 is executed. The OneStep function of the bus master A1 executes the IsWriteEnd function of the bus master interface B1. The bus master interface B1 returns the value indicating that the bus master interface B1 is writing the data. The bus master A1 then goes on standby, and the OneStep function of the bus master A1 is completed.

TABLE 23

```
#time 3
    OneStep of A1
        A1 executes IsWriteEnd(0) of B1.
            B1 returns that B1 is writing the data.
        A1 stays on standby.
    OneStep of B1
        Because B1 is permitted to use the bus, B1 writes the data into
the bus.
        That is, the following operations are performed.
            B1 extracts one data from the buffer.
                address: 0x00100004 data: 0x44556677 number of bytes: 4
            B1 executes WriteMap(0x00100004,0x44556677,4) of C1.
                WriteMap function of C1 performs the following operations.
                    Execute AppendWriteData(0,0x00100004,0x44556677,4)
                    function of D1.
                        D1 stores the given data into the buffer.
                    Execute StartWrite(0) function of D1.
                        D1 executes WriteBusSlave(0x00100004,0x44556677,4)
                        function of E1.
                            E1 internally writes the given data, and returns a
value,
                            indicating whether the writing is successful, to D1.
                            In the example, the writing is successful.
                    Execute IsWriteEnd(0) function of D1.
                        Because the writing from D1 into E1 has been
successful,
                            the return value is true.
                        Return IsWriteEnd(0) function of D1.
            B1 comes to know that the data has been successfully written,
            based on the return value.
            Then, B1 deletes one data from the buffer.
            There is no data in the buffer of B1.
            B1 completes the writing operation.
            The return value of IsWriteEnd(0) function of B1 is true.
    OneStep of C1
        no operation
    OneStep of D1
        no operation
    OneStep of E1
        The special operation of the bus slave E1 is performed,
        but does not includes an operation in connection with the bus.
time
```

When the OneStep function of the bus master A1 is completed, the OneStep function of the bus master interface B1 is executed. Since in the time 3 the OneStep function of the bus master interface B1 permits the bus master interface B1 to use the bus, the bus master interface B1 writes the data into the bus. That is, the following operation is performed.

The bus master interface B1 extracts one data unit from the buffer. At that time, the information includes the address of 0x00100004, the data of 0x44556677, and the number of bytes of 4. Then, the bus master interface B1 executes the function WriteMap (0x00100004, 0x44556677, 4) of the bus C1.

Then, the WriteMap function of the bus C1 performs the following operations. The WriteMap function of the bus C1 executes the function AppendWriteData (0, 0x00100004, 0x44556677, 4) of the bus slave interface D1. The bus slave interface D1 stores the given data into the buffer. The WriteMap function of the bus C1 executes the StartWrite function of the bus slave interface D1. The bus slave interface D1 executes the function WriteBusSlave (0x00100004, 0x44556677, 4) of the bus slave E1. The bus slave E1 stores the given data into the buffer. The bus slave E1 returns the value indicating whether the writing has been successful. In the example, the writing has been successful. The WriteMap function of the bus C1 executes the IsWriteEnd function of the bus slave interface D1. Because the writing of the data into the bus slave E1 by the bus slave interface D1 has been successful, the return value is true.

Thus, the WriteMap function of the bus C1 returns the return value of the IsWriteEnd function of the bus slave interface D1.

The bus master interface B1 comes to know, based on the return value, that the data has been successfully written. Then, one of the data is deleted from the buffer. Because no data remains in the buffer of the bus master interface B1, the bus master interface B1 completes the writing operation. Therefore, the return value of the IsWriteEnd function of the bus master interface B1 becomes true. Then, the OneStep function of the bus master interface B1 is completed.

When the OneStep function of the bus master interface B1 is completed, the OneStep function of the bus C1 is executed. The OneStep function of the bus C1 executes nothing, and is completed.

When the OneStep function of the bus C1 is completed, the OneStep function of the bus slave interface D1 is executed. The OneStep function of the bus slave interface D1 executes nothing, and is completed.

The OneStep function of the bus slave E1 is executed. The special operation of the bus slave E1 is performed, but does not includes the operation in connection with the bus.
[Timer 4]

In the time 4, as shown in Table 24, the OneStep function of the bus master A1 is executed. In the OneStep function of the bus master A1 in the time 4, the bus master A1 executes the IsWriteEnd function of the bus master interface B1. The bus master interface B1 returns the value indicating that the writing has been finished. Then, the bus master A1 starts the following operations. The OneStep function of the bus master interface B1, the OneStep function of the bus C1, and the OneStep function of the bus slave interface D1 are executed in order in the time 4. The OneStep functions do not execute any process. Then, the OneStep function of the bus slave E1 is executed. The special operation of the bus slave E1 is performed, but does not includes the operation in connection with the bus.

TABLE 24 time4
   OneStep of A1
      A1 executes IsWriteEnd(0) of B1.
         B1 returns a value indicating that the writing is completed.
      A1 starts the next operation.
   OneStep of B1
      no operation.
   OneStep of C1
      no operation
   OneStep of D1
      no operation
   OneStep of E1
      The special operation of the bus slave E1 is performed,
      but does not include an operation in connection with the bus.
time Thus, according to the operations in the times 1 to 4, the writing operation of the data, shown in FIG. 8, is completed.
[Split Transfer]

The other embodiment of the data transfer through the bus will be explained. The bus normally sends an instruction to write or read data only in the direction from the bus master to the bus slave. When a high performance bus cannot immediately respond to the read/write request sent from the bus master to the bus slave, the bus disconnects the communication, and then actively returns a value in the reverse direction from the bus slave to the bus master. This method is termed split transfer. The split transfer means a series of operations in which the master transmits an instruction to the slave, and after the transmission is completed, the slave transmits an instruction to the master in turn. The split transfer is achieved by a high performance bus. The simulation of the split transfer according to the embodiment will be explained.

In the split transfer, the relationship between the slave and the master is inverted.

That is, the bus slave leaves the complicated control of the bus to the bus slave interface. The bus slave registers all the data, to be written or read, into the buffer in the bus slave interface in a moment.

The communication from the bus slave interface to the bus master is executed whenever the OneStep function is executed.

When the OneStep function is called, the bus master interface extracts the data units one by one from the buffer, and sends it to the bus.

The bus determines the target bus master to be written or read, based on the bus read map, or on the bus write map, and sends a read or write command to the bus master interface corresponding to the determined bus master.

The bus master interface writes or reads data in the bus master, depending on the instruction sent from the bus, and returns the result to the bus.

The bus returns the result, sent from the bus master interface, to the bus slave interface.

The bus slave interface decides the operation in the next OneStep, based on the result sent from the bus.

To achieve the above functions, the bus slave and the bus master have the same functions, and the bus slave interface and the bus master interface have the same functions. Accordingly, in the embodiment, the bus slave and the bus master have the same configuration, and the bus slave interface and the bus master interface have the same configuration. To determine the direction of the transmission (that is, the master to the slave, or the slave to the master), the functions such as the AppendWriteData function have arguments "mode" (see Tables 14 to 17.). When mode is 1, the reverse operation is performed.
[Examples of Created Circuit Class]

Next, an example of creating a new circuit class will be explained. A user is to create a new bus master interface class with the name of CUserBusMstIntf. It is first declared that the new class CUserBusMstIntf inherits the CmBusMstIntf class. Accordingly, the CUserBusMstIntf class has the same functions as those of the CmBusMstIntf class. Then, these functions are overridden to create the new class CUserBusMstIntf which achieves the desired operations.

Another example of creating a new circuit class is shown, The user is to create a new CPU class with the name of CUserCpu. It is first declared that the new class CUserCpu inherits the CmCpu class. Accordingly, the CUserCpu class has the same functions as those of the CmCpu class. Then, these functions are overridden to create the new class CUserCpu which achieves desired operations.
[Main Advantages of the Embodiments]

The first advantage is that it is easy to replace the circuit module. That is, when one of the circuit modules in the system is replaced, the statements of the other circuit modules need not be changed.

The second advantage is that the connections between the circuit modules are automatically checked. That is, if the circuit modules are incorrectly connected, the compiler causes an error when in the compiling process.

The third advantage is that the configuration for displaying the information is commonly used by the circuit modules having the same property. That is, the configuration for displaying the information need not be separately prepared for each circuit module.

The fourth advantage is that the configuration for controlling the simulation is commonly used by the systems which are the simulation targets. That is, even if the system of the simulation target is changed, the configuration for controlling the simulation need not be changed.

The fifth advantage is that it is automatically checked whether the statements of the circuit interfaces are sufficient. That is, if the statements are insufficient, the compiler causes an error when in the compiling process.
[Reasons for the Above Advantages]

Figure 10:
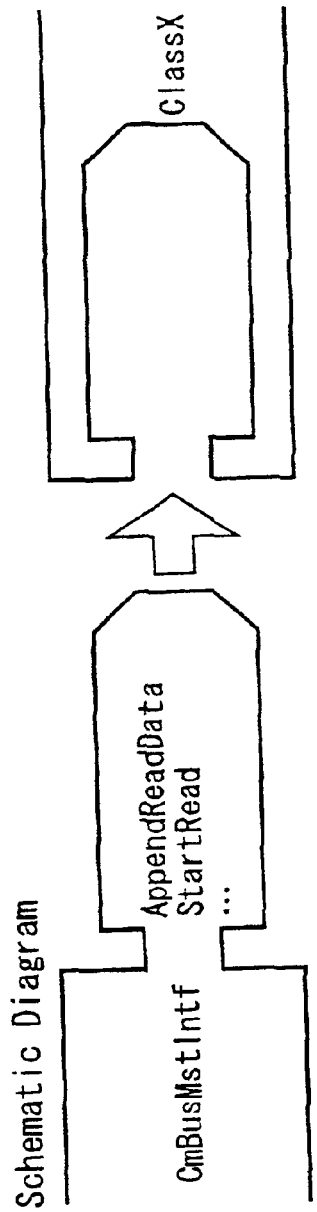
FIG. 10 is a diagram for explaining a method for creating a new class according to the embodiment of the present invention.
Figure 11:
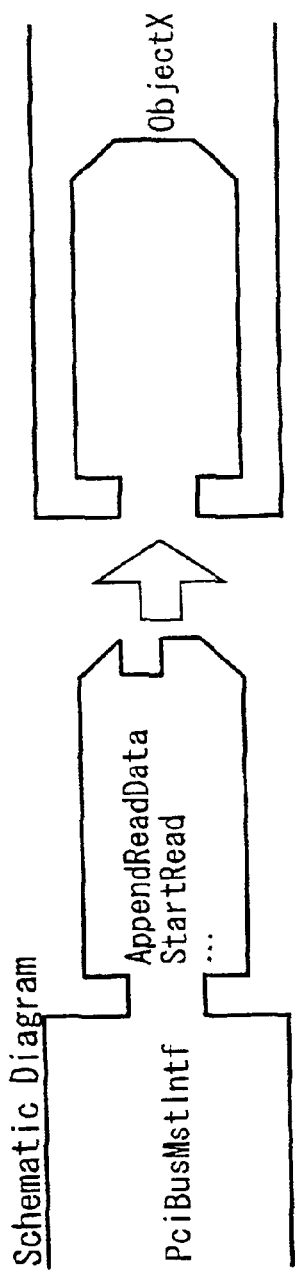
FIG. 11 is a diagram showing the examples of system statements using the class ClassX shown in FIG. 10.

The reason for the first advantage:

The reason for the first advantage will be explained with reference to Tables 24 to 26 and FIGS. 9 to 11. Table 25 shows the examples of the statements of a class ClassX, and FIG. 10 shows the relationship between the ClassX class and the CmBusMstIntf class. As shown in Table 25, in the class ClassX, a function ConnectBusMstIntf for connecting the circuit base class CmBusMstIntf to the class ClassX is defined ([1] in Table 25), and the AppendReadData function and the StartRead function of the object BusMstIntf of the circuit base class CmBusMstIntf is executed ([2] and [3] in Table 25). Thus, as shown in FIG. 10, the object of the class ClassX can execute the AppendReadData function and the StartRead functuin of the object of the class which inherits the circuit base class CmBusMstIntf.

TABLE 25

Statement of ClassX
    Class ClassX{
        CmBusMstIntf *BusMstIntf;        [1]
        Void ConnectBusMstIntf (CmBusMstIntf *busif) {
            BusMstIntf-busif;
        }
    void OneStep (void) {
        . . .
        BusMstIntf->AppendReadData(. . . );    [2]
        BusMstIntf->StartRead(. . .);    [3]
        }
    }

In the statements, shown in Table 26, of the system having the object ObjectX of the class ClassX, and the object PciBusMstIntf of the class CmPciBusMstIntf which is the derived class from the circuit base class CmVusMstIntf, the ObjectX is defined as the object of the ClassX ([1] in Table 26), the object PciBusMstIntf is defined as the object of the class CmPciBusMstIntf ([2] in Table 26), and the ObjectX is connected to the object of the class PciBusMstIntf by the ConnectBusMstIntf function. As shown in FIG. 11, the ObjectX can execute the AppendReadData function and the StartRead function of the object PciBusMstIntf.

TABLE 26

Example 1 of Statement of System
    Main() {
        ClassX ObjectX;    [1]
        CmPciBusMstIntf PciBusMstIntf;    [2]
        . . .
        ObjectX.ConnectBusMstIntf (&PcibusMstIntf);    [3]
    }

Figure 12:
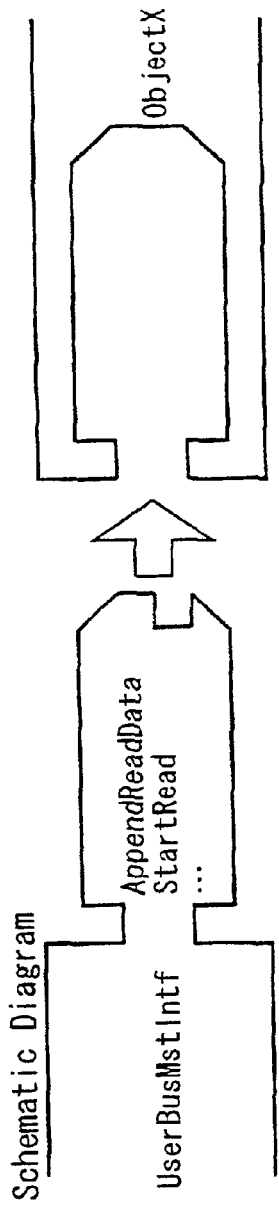
FIG. 12 is a diagram showing other examples of system statements using the class ClassX shown in FIG. 10.

In Table 27 and FIG. 12, the bus master interface object connected to the ObjectX is changed from the object PciBusMstIntf to the object UserBusMstIntf of the class CUserBusMstIntf which is derived from the common circuit base class CmBusMstIntf. To achieve the change, the object UserBusMstIntf is declared as the class CUserBusMstIntf, and the argument for executing the ConnectBusMstIntf of the ObjectX is simply changed from the address of the object PciBusMstIntf to the address of the object UserBusMstIntf. In this case, the statement of the object ClassX need not be changed.

TABLE 27

Example 2 of Statement of System
    Main() {
        ClassX ObjectX;
        CUserBusMstIntf UserBusMstIntf;
        . . .
        ObjectX.ConnectBusMstIntf (User&BusMstIntf);
        . . .}

As described above, when the circuit base class is common, for example, when the circuit base class CmBusMstIntf is defined as the base class for all the bus master interfaces, one of the classes ClassX declares that the bus master interface to communicate with is the CmBusMstIntf class. Even when the bus master interface to communicate with is changed, the statements of the ClassX need not be changed, and the object of the ClassX can communicate with the changed bus master interface according to the procedure defined in the CmBusMstIntf class. That is, even when connecting the circuit module X to a new bus master interface class CUserBusIntf, the statements of the circuit module X need not be changed.

When no circuit base class exists, to send an instruction from a circuit class X to the CUserBusMstIntf, it must be described in the statements of the class X that the receiver of the instruction of the class X is the object of the class CUserBusMstIntf. Therefore, to change the connection of the class X from the bus master interface to the CUserBusMstIntf, the statements of the class X must be changed.

Figure 13:
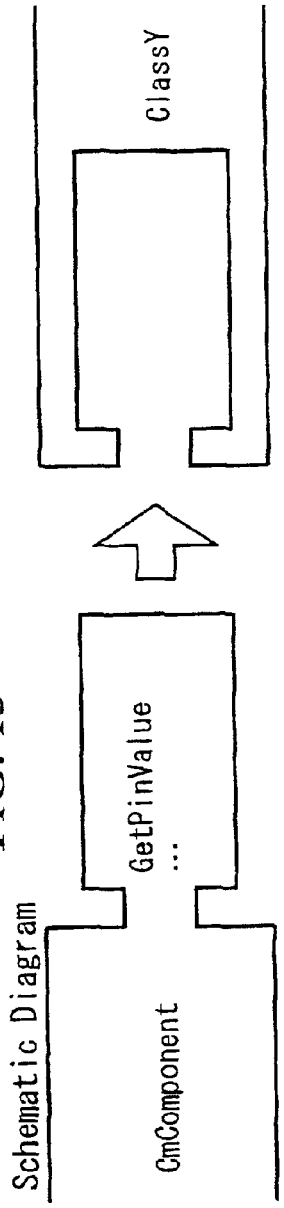
FIG. 13 is a diagram for explaining another method for creating a new class according to the embodiment of the present invention.

Another example will be explained with reference to Tables 27 to 29 and FIGS. 12 to 14. There is a circuit class ClassY. The ClassY reads a value from a terminal of another circuit, and is operated based on the value. According to the concept of the circuit base class, the statements (Table 28) of the ClassY describe that the circuit object to be read is the CmComponent class ([1] in Table 28). The GetPinValue function of the CmComponent class is executed to read the value at the terminal ([2] in Table 28).

TABLE 28

Statement of ClassY
    class ClassY{
        CmComponent *PointerComponent    [1]
        Void ConnectComponent (CmComponent *c) {
            PointerComponent=c;
        }
    void OneStep(void) {
        . . .
        . . . =PointerComponent->GetPinValue();    [2]
        . . .
        }
    };

It should be noticed that there is inheritance between the circuit base classes. For example, when The CuserCpu ([4] in Table 11), shown in Table 29 and FIG. 14, inherits the CmCpu class, the CUserCpu also inherits the CmComponent class. Accordingly, the CUserCpu has the properties of the CmComponent class. When using the member functions defined in the CmComponent class, the CUserCpu object can be connected to the object ClassY even if the statements of the class ClassY are not changed.

TABLE 29

Example of Statement of System
    Main() {
        ClassY ObjectY;
        CuserCpu UserCpu;    [1]
        . . .
        Object.YconnectComponent(&UserCpu);
        . . .}

As described above, when there is inheritance between the circuit base classes, as the circuit module can be replaced, and the statements need not be changed.

Figure 14:
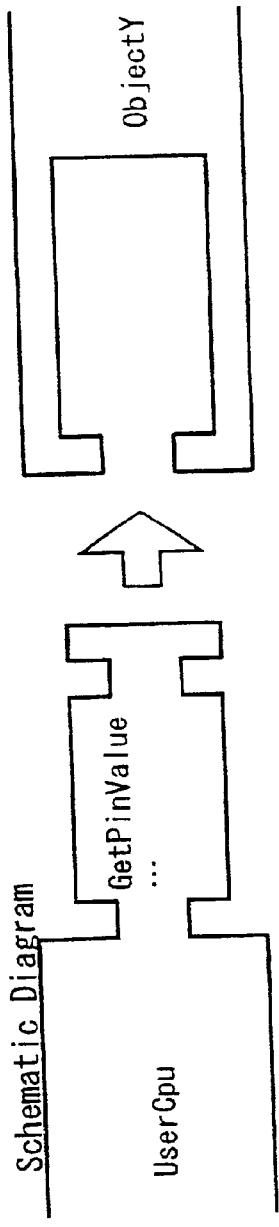
FIG. 14 is a diagram showing other examples of system statements using the class ClassY shown in FIG. 13.
Figure 15:
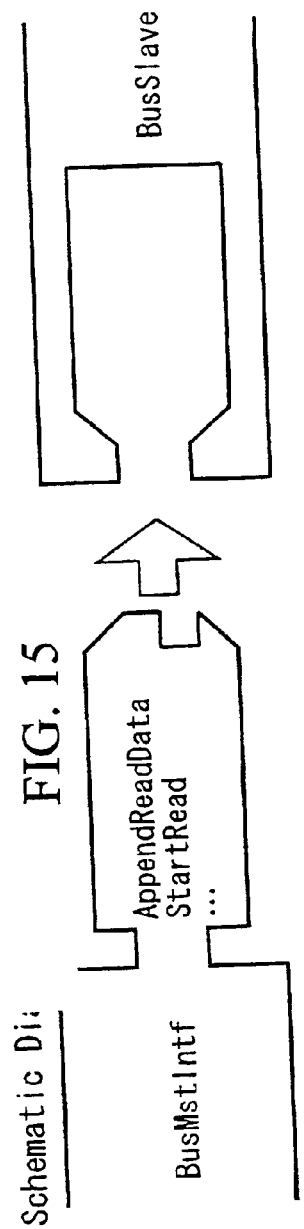
FIG. 15 is a diagram showing examples of system statements.

The reason for the second advantage:

In Table 30 and FIG. 14, the class CUserBusMstIntf derived from the circuit base class CmBusMstIntf of the bus master interface is to be incorrectly connected to the object BusSlave of the bus slave class CmBusSlave by the ConnectBusSlvIntf function. The ConnectBusSlvIntf function can connect the class CUserBusMstIntf only to the class whose base class is the CmBusSlvIntf class. When compiling the codes which connect the class whose base class is not the CmBusSlvIntf class, the C++ compiler outputs an error when checking the types of the classes in the compiling process according to the C++ specification. Therefore, it is automatically detected that the class CUserBusMstIntf which does not inherit the circuit base class CmBusSlvIntf is to be incorrectly connected to the class CmBusSlave ([1] in Table 30). Thus, because the incorrect connection always causes an error, this helps the user to correctly connect the classes.

TABLE 30

Statement in C++
    Main () {
        CmBusSlave BusSlave;
        CmBusMstIntf BusMstIntf;
        . . .
        BusSlave.ConnectBusSlvIntf(&BusMstIntf). //Error [1]
        . . .}

The reason for the third advantage

The information display section of the object Cpu for the model of the CPU processes the information obtained by the functions, such as the GetPc function, and the GetReg function, for extracting the internal state of the object Cpu, and displays the internal information to the user. The information display section is defined in the circuit base class CmCpu, and it is described that the object Cpu is in the CmCpu class. Accordingly, the circuit Cpu which inherits the CmCpu class can use the information processing section. For example, when the new user created class CUserCpu inherits the CmCpu class, the CUserCpu class can use the information processing section of the CPU defined in the class CmCpu. That is, a new information display section for a new CPU class CUserCpu need not be prepared.

The reason for the fourth advantage

Since the system is a sequential circuit (clock synchronous circuit) having a clock, the system has the property of the CmSyncModule class. The simulation controller handles the system as the CmSyncModule class, and controls the simulation by the Reset function, the OneStep function, etc. Thus, as long as the systems inherit the CmSyncModule class, the single configuration for controlling the simulation can be commonly used by all the systems.

The reason for the fifth advantage

In the bus slave, the ReadBusSlave function, and the WriteBusSlave function send, or receive the value to or from the bus. The contents of the processes must be described. In the circuit base class CmBusSlave class of the bus slave, the ReadBusSlave function, and the WriteBusSlave function are pure virtual functions. Therefore, even when there is an omission in the statements of the ReadBusSlave function, and the WriteBusSlave function in the bus slave circuit class, the C++ compiler outputs an error message, indicating that the pure virtual function is not overridden in the compiling process as long as the CmBusSlave class is inherited Thus, the omission in the statements of the necessary functions can be automatically checked.

The above-described embodiments are to be considered illustrative, and the present invention is not limited to the embodiments. For example, the object oriented language is not limited to the C++ language, and may be a language, such as JAVA, which is equal to the configuration for providing the object oriented technique such as inheritance, classes, etc. The circuit base classes are not limited to the above classes; a new class with the property of an optional circuit module may be added, and a class which integrates the above classes may be created.

The simulation method and apparatus of the present invention can be provided by a computer and a simulation program executed by the computer. The program, to be executed by the computer, can be distributed by a computer-readable storage medium.

The present invention describes the system with a plurality of modules using the features of the object oriented language such as the inheritance, and the classes. Therefore, when simulating the system, the statements of the circuit modules and the connections between the modules, and the expansion or change of the circuit modules and the system can be easily and reliably achieved as compared with the conventional technique.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A simulation method for simulating a system having a plurality of circuit modules using software, comprising the steps of:

using an object oriented language;

preparing a plurality of circuit base classes, which describe base circuit modules as classes, as a library;

describing the circuit modules to be simulated as classes by inheriting the circuit base classes prepared as the library; and describing the system to be simulated by combining the circuit modules described as the classes.

2. A simulation method according to claim 1, further comprising the step of describing the system as a class by inheriting the circuit base classes prepared in the library.

3. A simulation method according to claim 1, further comprising the step of preparing a component class having the properties of a circuit which contains a circuit operating asynchronously with a clock signal, and a synchronous module class, having the properties of a circuit operating synchronously with the clock signal in the library, which is derived from said component class.

4. A simulation method according to claim 3, further comprising the step of preparing a bus class having the properties of a bus, a bus master class having the properties of a bus master, and a bus slave class having the properties of a bus slave, as the circuit base class described as a class derived from the synchronous module class, in the library.

5. A simulation method according to claim 4, further comprising the step of preparing a bus master interface class, whose base classes are the synchronous module class, and which has the properties of a bus master interface, and a bus slave interface class having the properties of a bus slave interface, as the circuit base class in the library.

6. A simulation method according to claim 4, further comprising the step of preparing a memory class, whose base class is the bus slave class, and which has the properties of a memory, as the circuit base class in the library.

7. A simulation method according to claim 3, further comprising the step of preparing a central processing unit class, whose base class is the synchronous module class, and which has the properties of a central processing unit, as the circuit base class in the library.

8. A simulation method according to claim 3, further comprising the step of preparing a hierarchy class, whose base class is the synchronous module class, and which has the properties of a hierarchy of a circuit containing the bus, as the circuit base class in the library.

9. A simulating apparatus, using a computer, for simulating a system having a plurality of circuit modules, said simulation apparatus comprising:

storage means storing a plurality of circuit base classes, which describe base circuit modules as classes, as a library;

means accessing the storage means and describing the circuit modules to be simulated as classes by inheriting the circuit base classes stored in the library; and means combining the circuit modules described as classes to describe the system to be simulated.

10. A simulating apparatus according to claim 9, wherein the means combining the circuit modules describes the system to be simulated as a class by inheriting the circuit base classes prepared in the library.

11. A simulating apparatus according to claim 9, wherein the storage means stores a component class having the properties of a circuit which contains a circuit operating asynchronously with a clock signal, and a synchronous module class, having the properties ofa circuit operating synchronously with the clock signal in the library, which is derived from said component class.

12. A simulating apparatus according to claim 11, wherein the storage means stores a bus class having the properties of a bus, a bus master class having the properties of a bus master, and a bus slave class having the properties of a bus slave, as the circuit base class described as a class derived from the synchronous module class, in the library.

13. A simulating apparatus according to claim 12, where in the storage means stores a bus master interface class, whose base classes art the synchronous module class, and which has the properties of a bus master interface, and a bus slave interface class having the properties of a bus slave interface, as the circuit base class in the library.

14. A simulating apparatus according to claim 12, wherein the storage means stores a memory class, whose base class is the bus slave class, and which has the properties of a memory, as the circuit base class an the library.

15. A simulating apparatus according to claim 11, wherein the storage means stores a central processing unit class, whose base class is the synchronous module class, and which has the properties of a central processing unit, as the circuit base class in the library.

16. A simulating apparatus according to claim 11, wherein the storage means stores a hierarchy class, whose base class is the synchronous module class, and which has the properties of a hierarchy of a circuit containing the bus, as the circuit bass class in the library.

17. A computer-readable storage medium for storing a computer program for executing a simulation method for simulating a system having a plurality of circuit modules, the computer program comprising the steps of:

using an object oriented language;

preparing a plurality of circuit base classes, which describe base circuit modules as classes, as a library;

describing the circuit modules to be simulated as classes by inheriting the circuit base classes prepared as a library; and describing the system to be simulated by combining the circuit modules described as classes.

18. A computer-readable storage medium according to claim 17, wherein the computer program further comprises the step of describing the system as a class by inheriting the circuit base classes prepared in the library.

19. A computer-readable storage medium according to claim 17, wherein the computer program further comprises the step of preparing a component class having the properties of a circuit which contains a circuit operating asynchronously with a clock signal, and a synchronous module class, having the properties of a circuit operating synchronously with the clock signal in the library, which is derived from said component class.

20. A computer-readable storage medium according to claim 19, wherein the computer program further comprises the step of preparing a bus class having the properties of a bus, a bus master class having the properties ofabus master, and abus slave class having the properties of a bus slave, as the circuit base class described as a class derived from the synchronous module class, in the library.

21. A computer-readable storage medium according to claim 20, wherein the computer program further comprises the step of preparing a bus master interface class, whose base classes are the synchronous module class, and which has the properties of a bus master interface, and a bus slave interface class having the properties of a bus slave interface, as the circuit base class in the library.

22. A computer-readable storage medium according to claim 20, wherein the computer program further comprises che step of preparing a memory class, whose base class is the bus slave class, and which has the properties of a memory, as the circuit base class in the library.

23. A computer-readable storage medium according to claim 19, wherein the computer program further comprises the step of preparing a central processing unit class, whose base class is the synchronous module class, and which has the properties of a central processing unit, as the circuit base class in the library.

24. A computer-readable storage medium according to claim 19, wherein the computer program further comprises the step of preparing a hierarchy class, whose base class is the synchronous module class, and which has the properties of a hierarchy of a circuit containing the bus, as the circuit base class in the library.

* * * * *